(12) United States Patent
Cha et al.

(10) Patent No.: US 10,255,989 B2
(45) Date of Patent: Apr. 9, 2019

(54) SEMICONDUCTOR MEMORY DEVICES, MEMORY SYSTEMS INCLUDING THE SAME AND METHODS OF OPERATING THE SAME

(71) Applicant: SAMSUNG ELECTRONICS CO., LTD., Suwon-si, Gyeonggi-Do (KR)

(72) Inventors: Sang-Uhn Cha, Yongin-si (KR); Hoi-Ju Chung, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/233,088

(22) Filed: Aug. 10, 2016

(65) Prior Publication Data

US 2017/0139641 A1  May 18, 2017

(30) Foreign Application Priority Data

Nov. 16, 2015  (KR) .......................... 10-2015-0160111

(51) Int. Cl.
| | | |
|---|---|---|
| *G06F 11/10* | (2006.01) | |
| *G11C 29/52* | (2006.01) | |
| *G11C 11/406* | (2006.01) | |
| *G11C 11/4096* | (2006.01) | |
| *G11C 11/408* | (2006.01) | |
| *G11C 11/4076* | (2006.01) | |
| *G11C 29/00* | (2006.01) | |
| *G11C 11/16* | (2006.01) | |

(52) U.S. Cl.
CPC .......... *G11C 29/52* (2013.01); *G06F 11/1068* (2013.01); *G11C 11/406* (2013.01); *G11C 11/4076* (2013.01); *G11C 11/4087* (2013.01); *G11C 11/4096* (2013.01); *G11C 11/40611* (2013.01); *G11C 11/16* (2013.01); *G11C 29/70* (2013.01)

(58) Field of Classification Search
CPC ...................................................... G06F 11/10
USPC ................................ 714/764, 766, 772, 770
See application file for complete search history.

(56) References Cited

U.S. PATENT DOCUMENTS

| | | | |
|---|---|---|---|
| 6,292,869 | B1 | 9/2001 | Gerchman et al. |
| 7,275,130 | B2 | 9/2007 | Klein |
| 8,255,772 | B1 | 8/2012 | Foley |
| 8,307,259 | B2 | 11/2012 | Wheeler et al. |
| 8,370,720 | B2 | 2/2013 | Allen |
| 8,775,865 | B2 | 7/2014 | Yang |

(Continued)

FOREIGN PATENT DOCUMENTS

| | | |
|---|---|---|
| EP | 0424301 | 4/1991 |
| KR | 1020160023151 | 3/2016 |

*Primary Examiner* — Fritz Alphonse
(74) *Attorney, Agent, or Firm* — F. Chau & Associates, LLC

(57) ABSTRACT

A semiconductor memory device includes a memory cell array and a main controller. The memory cell array includes a plurality of memory bank arrays, and each of the memory bank arrays includes a plurality of pages. The main controller counts a number of accesses to a first memory region of the memory cell array, generates at least one victim address of at least one neighbor memory region that is adjacent to the first memory region and performs a scrubbing operation sub-pages of the pages corresponding to the at least one victim address when the counted number of accesses reaches a first reference value during a reference interval.

20 Claims, 24 Drawing Sheets

(56) References Cited

U.S. PATENT DOCUMENTS

| | | | |
|---|---|---|---|
| 2011/0141825 A1* | 6/2011 | Hatanaka | G11C 11/417 365/189.07 |
| 2013/0105792 A1* | 5/2013 | Yamazaki | C23C 14/08 257/43 |
| 2014/0089576 A1 | 3/2014 | Bains et al. | |
| 2015/0036394 A1* | 2/2015 | Yang | H02M 3/33507 363/21.18 |
| 2015/0254136 A1* | 9/2015 | Hoya | G06F 11/1012 714/764 |
| 2015/0262638 A1* | 9/2015 | Miyakawa | G11C 11/1659 365/158 |
| 2016/0055056 A1 | 2/2016 | Son et al. | |

* cited by examiner

SEMICONDUCTOR MEMORY DEVICES, MEMORY SYSTEMS INCLUDING THE SAME AND METHODS OF OPERATING THE SAME

CROSS-REFERENCE TO RELATED APPLICATIONS

This U.S. application claims priority under 35 USC § 119 to Korean Patent Application No. 10-2015-0160111, filed on Nov. 16, 2015, in the Korean Intellectual Property Office, the disclosure of which is incorporated by reference in its entirety herein.

BACKGROUND

1. Technical Field

The present disclosure relates to memories, and more particularly to semiconductor memory devices, memory systems including the same and methods of operating the same.

2. Discussion of Related Art

Semiconductor memory devices may be classified into non-volatile memory devices such as flash memory devices and volatile memory devices such as Dynamic Random Access Memories (DRAMs). High speed operation and cost efficiency of DRAMs make it possible for DRAMs to be used for computer system memories.

Electrical or magnetic interference inside a computer system can cause a single bit of a DRAM to spontaneously flip to the opposite state, resulting in a bit error. Further, when a specific address is intensively applied to the DRAM, data retention reliability of memory cells coupled to a word-line designated by the specific address may degrade.

SUMMARY

According to an exemplary embodiment of the inventive concept, a semiconductor memory device includes a memory cell array, and a main controller. The memory cell array includes a plurality of bank array, and each of the bank arrays includes a plurality of pages. The main controller counts a number of accesses to a first memory region of the memory cell array, generates at least one victim address of at least one neighbor memory region that is adjacent to the first memory region and performs a scrubbing operation on sub-pages of the pages corresponding to the at least one victim address when the counted number of accesses reaches a first reference value during a reference interval.

According to an exemplary embodiment of the inventive concept, a memory system includes one or more of the above described semiconductor memory devices and a memory controller. The memory controller controls the at least one semiconductor memory device.

According to an exemplary embodiment, a method of operating a semiconductor memory device including a memory cell array is provided. The method includes a first controller (e.g., a scrubbing controller) of the memory device counting a number of accesses to a first memory region of the memory cell array to determine whether a disturbance on at least one neighbor memory region reaches a reference value. The at least one neighbor memory region is located adjacent to the first memory region. The method further includes a second controller (e.g., an error correction circuit) performing a scrubbing operation on some sub-pages of the at least one neighbor memory region when the counted number of accesses reaches the reference value.

According to an exemplary embodiment of the inventive concept, a semiconductor memory device includes a memory cell array and a main controller. The main controller is configured to receive an access command through a first pin of the memory device and a memory address through a second pin of the memory device to access a first memory region of the memory cell array, output a signal to a memory controller through a third pin of the memory device when accesses to the first memory region have exceeded a reference value during a given time interval, and perform a scrubbing operation on a second memory region adjacent to the first memory region in response to a scrubbing command received from the memory controller through the first pin and sent by the memory controller in response to the signal.

BRIEF DESCRIPTION OF THE DRAWINGS

Exemplary embodiments of the inventive concept will be described below in more detail with reference to the accompanying drawings.

DETAILED DESCRIPTION

The inventive concept will be described more fully hereinafter with reference to the accompanying drawings, in which exemplary embodiments thereof are shown. However, the present inventive concept may be embodied in many different forms and should not be construed as limited to the exemplary embodiments set forth herein. It should also be emphasized that the present inventive concept provides details of alternative examples, but such listing of alternatives is not exhaustive. Like numerals refer to like elements throughout.

It will be understood that when an element is referred to as being "connected" or "coupled" to another element, it can be directly connected or coupled to the other element or intervening elements may be present. As used herein, the singular forms "a," "an" and "the" are intended to include the plural forms as well, unless the context clearly indicates otherwise.

Figure 1:
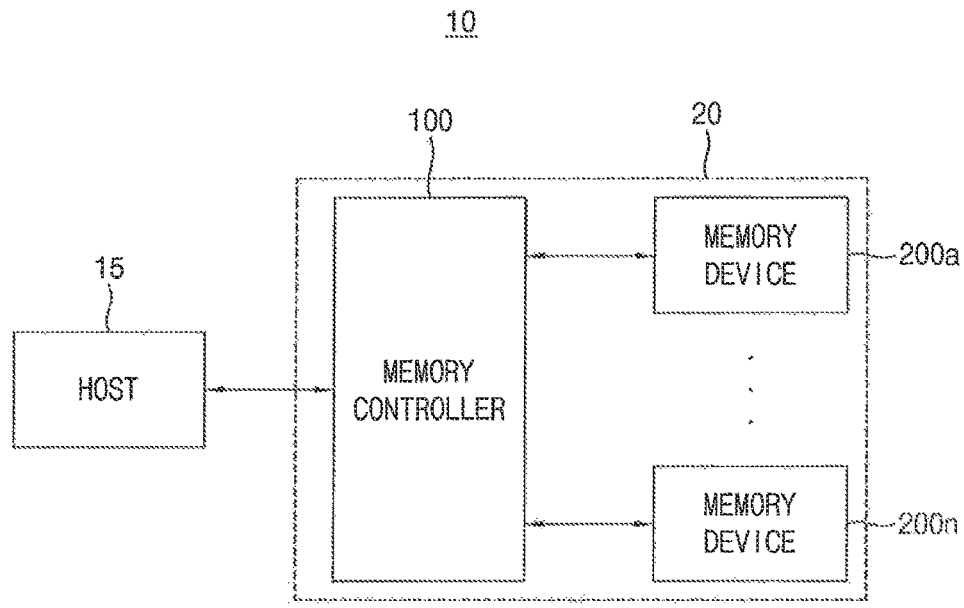
FIG. 1 is a block diagram illustrating an electronic system according to an exemplary embodiment of the inventive concept.

FIG. 1 is a block diagram illustrating an electronic system according to an exemplary embodiment of the inventive concept.

Referring to FIG. 1, an electronic system (or an electronic device) 10 includes a host 15 (e.g., a host device, a host computer, etc.) and a memory system 20. The memory system 20 includes a memory controller 100 and a plurality of semiconductor memory devices 200a~200n (n is an integer greater than two).

The host 15 may communicate with the memory system 20 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 15 may also communicate with the memory system 20 through interface protocols such as Universal Serial Bus (USB), Multi-Media Card (MMC), Enhanced Small Disk Interface (ESDI), or Integrated Drive Electronics (IDE).

The memory controller 100 may control an overall operation of the memory system 20. The memory controller 100 may control overall data exchange between the host 15 and the plurality of semiconductor memory devices 200a~200n. For example, the memory controller 100 may write data into the plurality of semiconductor memory devices 200a~200n or read data from the plurality of semiconductor memory devices 200a~200n in response to a request (e.g., a request message) from the host 15. For example, the request may be a read request including a read command or a write request including a write command and data to write. The read command and the write command may be referred to as access commands.

In addition, the memory controller 100 may issue operation commands to the plurality of semiconductor memory devices 200a~200n for controlling the plurality of semiconductor memory devices 200a~200n.

In an exemplary embodiment, each of the plurality of semiconductor memory devices 200a~200n is a memory device including resistive type memory cells such as a magnetoresistive random access memory (MRAM), a resistive random access memory (RRAM), a phase change random access memory (PRAM) and a ferroelectric random access memory (FRAM), etc. In an exemplary embodiment, each of the plurality of semiconductor memory devices 200a~200n includes dynamic memory cells such as a dynamic random access memory (DRAM).

An MRAM is a nonvolatile computer memory based on magnetoresistance. An MRAM is different from a volatile RAM in many aspects. For example, since an MRAM is nonvolatile, the MRAM may retain all stored data even when power is turned off.

Although a nonvolatile RAM is generally slower than a volatile RAM, an MRAM has read and write response times comparable with read and write response times of a volatile RAM. Unlike a volatile RAM that stores data as an electric charge, an MRAM stores data by using magnetoresistance (or magnetoresistive) elements. In general, a magnetoresistance element is made of two magnetic layers, each having a magnetization.

An MRAM is a nonvolatile memory device that reads and writes data by using a magnetic tunnel junction pattern including two magnetic layers and an insulating film disposed between the two magnetic layers. A resistance value of the magnetic tunnel junction pattern may vary according to a magnetization direction of each of the magnetic layers. The MRAM may program or remove data by using the variation of the resistance value.

An MRAM using a spin transfer torque (STT) phenomenon uses a method in which when a spin-polarized current flows in one direction, a magnetization direction of the magnetic layer is changed due to the spin transfer of electrons. A magnetization direction of one magnetic layer (e.g., a pinned layer) may be fixed and a magnetization direction of the other magnetic layer (e.g., a free layer) may vary according to a magnetic field generated by a program current.

The magnetic field of the program current may arrange the magnetization directions of the two magnetic layers in parallel or in anti-parallel. In at least one exemplary embodiment, if the magnetization directions of the two magnetic layers are parallel, a resistance between the two magnetic layers is in a low ("0") state. If the magnetization directions of the two magnetic layers are anti-parallel, a resistance between the two magnetic layers is in a high ("1") state. Switching of the magnetization direction of the free layer and the high or low state of the resistance between the two magnetic layers results in write and read operations of the MRAM.

Although the MRAM is nonvolatile and provides a quick response time, an MRAM cell has a limited scale and is sensitive to a write disturbance because the program current applied to switch the high and low states of the resistance between the magnetic layers of the MRAM is typically high. Accordingly, when a plurality of cells are arranged in an MRAM array, a program current applied to one memory cell can inadvertently change a magnetic field of a free layer of an adjacent cell. Such a write disturbance may be mitigated (or alternatively, prevented) by using an STT phenomenon. A typical STT-MRAM may include a magnetic tunnel junction (MTJ), which is a magnetoresistive data storage device including two magnetic layers (e.g., a pinned layer and a free layer) and an insulating layer disposed between the two magnetic layers.

A program current typically flows through the MTJ. The pinned layer spin-polarizes electrons of the program current, and a torque is generated as the spin-polarized electron current passes through the MTJ. The spin-polarized electron current applies the torque to the free layer while interacting with the free layer. When the torque of the spin-polarized electron current passing through the MTJ is greater than a threshold switching current density, the torque applied by the spin-polarized electron current is sufficient to switch a magnetization direction of the free layer. Accordingly, the magnetization direction of the free layer may be parallel or anti-parallel to the pinned layer and a resistance state in the MTJ is changed.

The STT-MRAM removes a requirement of an external magnetic field for the spin-polarized electron current to switch the free layer in the magnetoresistive device. In addition, the STT-MRAM improves scaling as a cell size is reduced and the program current is reduced to mitigate (or alternatively, prevent) the write disturbance. In addition, the STT-MRAM may have a high tunnel magnetoresistance ratio, which improves a read operation in a magnetic domain by allowing a high ratio between the high and low states.

An MRAM is low cost and has high capacity (like a dynamic random access memory (DRAM), operates at high speed (like a static random access memory (SRAM), and is nonvolatile (like a flash memory).

Figure 2:
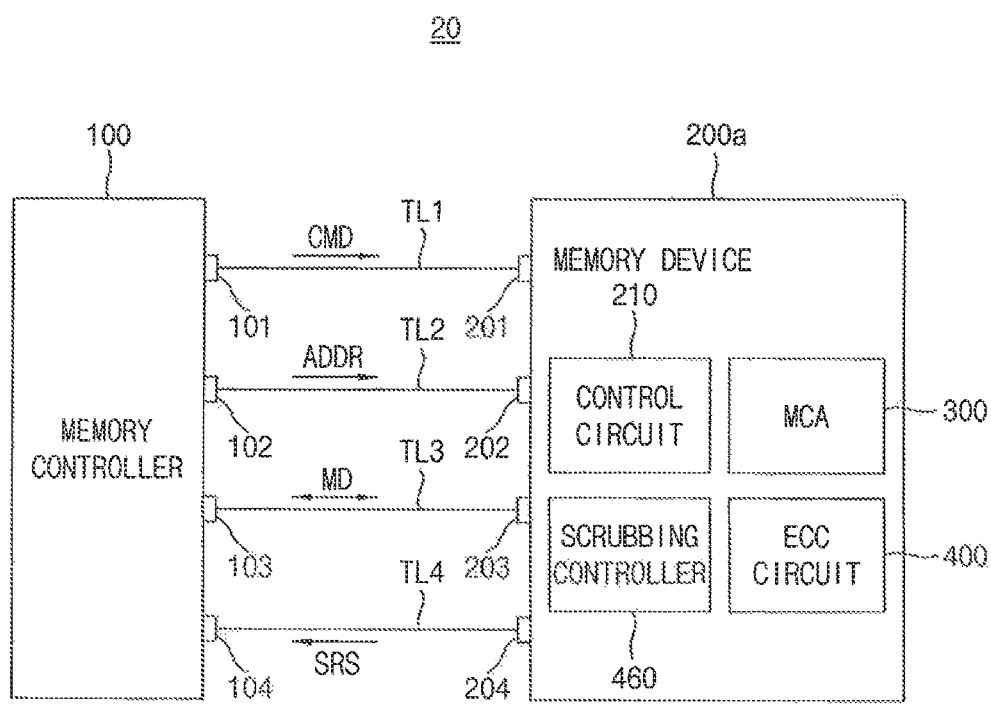
FIG. 2 is a block diagram illustrating the memory system shown in FIG. 1 according to an exemplary embodiment of the inventive concept.

FIG. 2 is a block diagram illustrating the memory system shown in FIG. 1 according to an exemplary embodiment of the inventive concept.

In FIG. 2, only one semiconductor memory device 200a in communication with the memory controller 100 is illustrated for convenience. However, the details discussed herein related to a semiconductor memory device 200a may equally apply to the other semiconductor memory devices 200b~200n.

Referring to FIG. 2, the memory system 20 includes the memory controller 100 and the semiconductor memory device 200a. Each of the memory controller 100 and the semiconductor memory device 200a may be formed as a separate semiconductor chip or as a separate group of chips (e.g., the memory controller 100 and the semiconductor memory device 200a may be packaged together in a stack of the semiconductor chips).

The memory controller 100 and the semiconductor memory device 200a are connected to each other through corresponding command pins 101 and 201, corresponding address pins 102 and 202, corresponding data pins 103 and 203 and corresponding separate pins 104 and 204. The command pins 101 and 201 transmit a command signal CMD through a command transmission line TL1, the address pins 102 and 202 transmit an address signal ADDR through an address transmission line TL2, and the data pins 103 and 203 exchange main data MD through a data transmission line TL3. The separate pins 104 and 204 transmit a scrubbing request signal SRS through a transmission line TL4. In an exemplary embodiment of the inventive concept, the semiconductor memory device 200a sends a scrubbing request signal SRS to the memory controller 100, the memory controller 100 sends a scrubbing command to the semiconductor memory device 200a in response to the scrubbing request signal SRS, and the semiconductor memory device 200a performs a scrubbing operation on at least one victim page in response to the scrubbing command.

The semiconductor memory device 200a include a memory cell array 300 ('MCA') that stores the main data MD, an error correction circuit 400 ('ECC') and a control logic circuit 210 (also referred to as a 'control logic') that controls the error correction circuit 400. In addition, the semiconductor memory device 200a includes a scrubbing controller 460 (e.g., an additional control circuit) that adjusts timing of a scrubbing operation performed on a neighbor memory region that is located adjacent to a first memory region that is extensively accessed. A memory region may be considered extensively accessed when it is accessed (e.g., read from and/or written to) more often than a pre-defined access rate. In an embodiment, a main controller includes the control circuit 210a, the scrubbing controller 460, and the ECC circuit 400.

Figure 3:
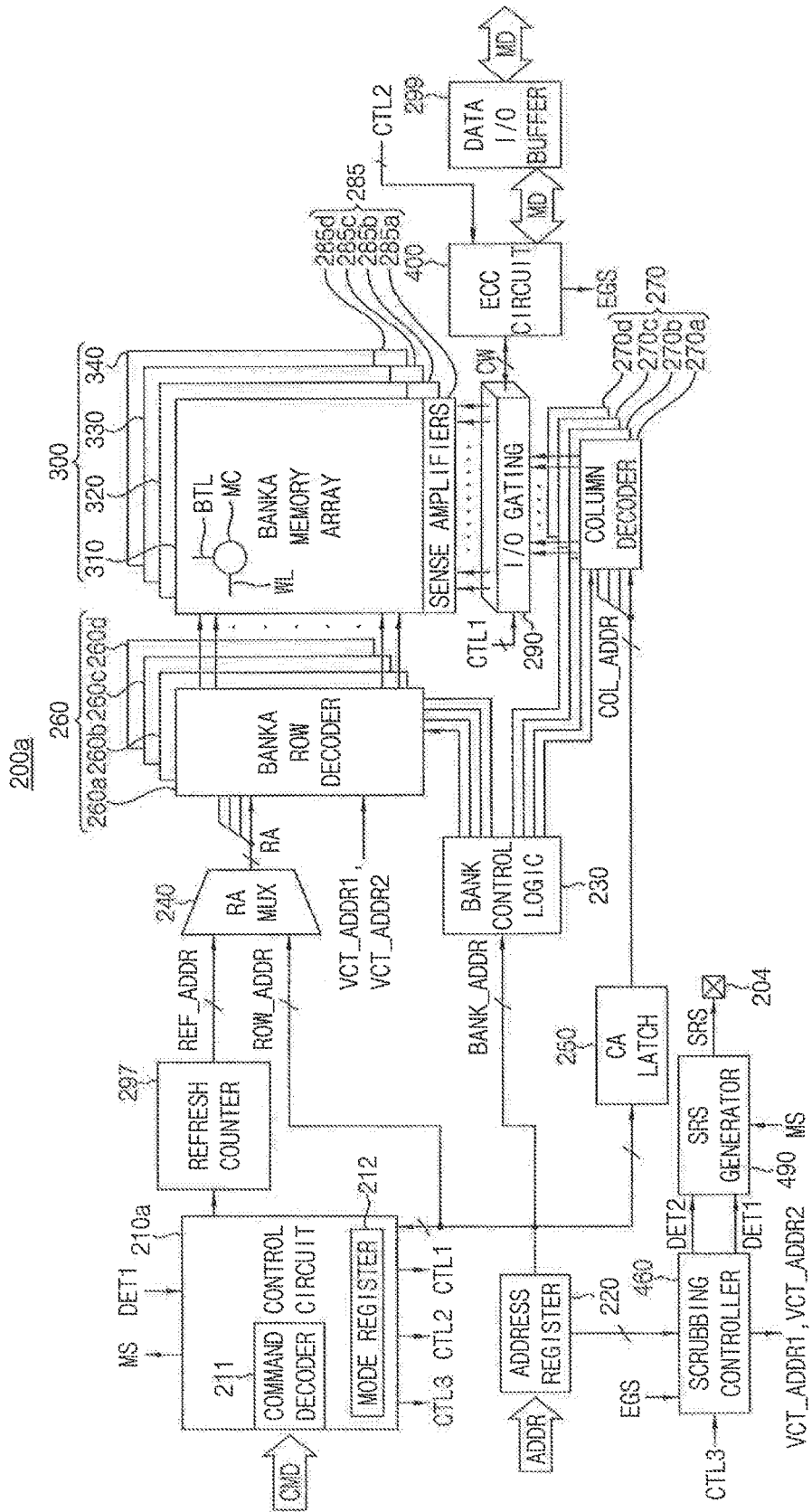
FIG. 3 is a block diagram illustrating the semiconductor memory device shown in FIG. 2, according to an exemplary embodiment of the inventive concept.

FIG. 3 is a block diagram illustrating the semiconductor memory device in FIG. 2 according to an exemplary embodiment of the inventive concept.

Referring to FIG. 3, the semiconductor memory device 200a includes a control logic circuit 210a (e.g., an embodiment of 210), an address register 220, a bank control logic 230, a refresh counter 297, a row address multiplexer 240 ('RA MUX'), a column address latch 250 ('CA LATCH'), a row decoder 260, a column decoder 270, the memory cell array 300, a sense amplifier unit 285, an input/output (I/O) gating circuit 290, the error correction circuit 400 ('ECC CIRCUIT'), a data input/output (I/O) buffer 299, the scrubbing controller 460 and a scrubbing request signal generator 490 ('SRS GENERATOR'). The column address latch 250 may include one or more latch circuits. The sense amplifier unit 285 may include one or more sense amplifiers.

In an embodiment, the refresh counter 297 is omitted from the semiconductor memory device 200a. That is, when the memory cell array 300 is implemented with a plurality of resistive type memory cells, the refresh counter 297 is omitted from the semiconductor memory device 200a.

The memory cell array 300 includes first through fourth bank arrays 310~340. The row decoder 260 includes first through fourth bank row decoders 260a~260d respectively coupled to the first through fourth bank arrays 310~340. The column decoder 270 includes first through fourth bank column decoders 270a~270d respectively coupled to the first through fourth bank arrays 310~340. The sense amplifier unit 285 includes first through fourth bank sense amplifiers 285a~280d respectively coupled to the first through fourth bank arrays 310~340. Each of the first through fourth bank arrays 310~340 may include a plurality of memory cells MC, and each of memory cells MC is coupled to a corresponding word-line WL and a corresponding bit-line BTL. The first through fourth bank arrays 310~340, the first through fourth bank row decoders 260a~260d, the first through fourth bank column decoders 270a~270d and first through fourth bank sense amplifiers 285a~280d form first through fourth banks. Although the semiconductor memory device 200a shown in FIG. 3 illustrates four banks, the semiconductor memory device 200a may have fewer than four banks or greater than four banks in other embodiments.

The address register 220 receives an address ADDR including a bank address BANK_ADDR, a row address ROW_ADDR and a column address COL_ADDR from the memory controller 100. The address register 220 provides the received bank address BANK_ADDR to the bank control logic 230, provides the received row address ROW_ADDR to the row address multiplexer 240, and provides the received column address COL_ADDR to the column address latch 250.

The bank control logic 230 may generate bank control signals in response to the bank address BANK_ADDR. One of the first through fourth bank row decoders 260a~260d corresponding to the bank address BANK_ADDR may be activated in response to the bank control signals, and one of the first through fourth bank column decoders 270a~270d corresponding to the bank address BANK_ADDR may be activated in response to the bank control signals.

The refresh counter 297 generates a refresh row address REF_ADDR for refreshing memory cell rows in the memory cell array 300 under control of the control logic circuit 210a. The refresh counter 297 may be included when the memory cells MC are implemented with dynamic memory cells.

The row address multiplexer 240 receives the row address ROW_ADDR from the address register 220, and receives the refresh row address REF_ADDR from the refresh counter 297. The row address multiplexer 240 selectively outputs the row address ROW_ADDR or the refresh row address REF_ADDR as a row address RA. The row address RA that is output from the row address multiplexer 240 is applied to the first through fourth bank row decoders 260a~260d.

The activated one of the first through fourth bank row decoders 260a~260d decodes the row address RA that is output from the row address multiplexer 240, and activates a word-line corresponding to the row address RA. For example, the activated bank row decoder may apply a word-line driving voltage to the word-line corresponding to the row address RA.

The column address latch 250 receives the column address COL_ADDR from the address register 220, and temporarily stores the received column address COL_ADDR. In an embodiment, in a burst mode, the column address latch 250 generates column addresses that increment from the received column address COL_ADDR. The column address latch 250 may apply the temporarily stored or generated column addresses to the first through fourth bank column decoders 270a~270d.

The activated one of the first through fourth bank column decoders 270a~270d decodes the column address COL_ADDR that is output from the column address latch 250, and controls the I/O gating circuit 290 to output data corresponding to the column address COL_ADDR.

The I/O gating circuit 290 may include circuitry for gating input/output data. The I/O gating circuit 290 may further include input data mask logic, read data latches for storing data that is output from the first through fourth bank arrays 310~340, and write drivers for writing data to the first through fourth bank arrays 310~340.

Data read from one bank array of the first through fourth bank arrays 310~340 may be sensed by sense amplifiers coupled to the one bank array from which the data is to be read, and may be stored in the read data latches. Main data MD to be written into one bank array of the first through fourth bank arrays 310~340 may be provided to the data I/O buffer 299 from the memory controller 100. The main data MD provided to the data I/O buffer 299 is provided to the error correction circuit 400. The main data MD is encoded in the error correction circuit 400 to generate a codeword CW, and the codeword CW is provided to the I/O gating circuit 290. The write driver may write the codeword CW in one bank array of the first through fourth bank arrays 310~340.

The data I/O buffer 299 may provide the main data MD from the memory controller 100 to the error correction circuit 400 in a write operation and may provide the main data MD from the error correction circuit 400 to the memory controller 100 in a read operation. The data I/O buffer 299 may receive the data mask signal DM from the memory controller 100 and may provide the data mask signal DM to the I/O gating circuit 290.

The error correction circuit 400, in a write operation, may generate parity data based on the main data MD from the data I/O buffer 299, and may provide the I/O gating circuit 290 with the codeword CW including the main data MD and the parity data. The I/O gating circuit 290 may write the codeword CW in one bank array.

In addition, the error correction circuit 400, in a read operation, may receive the codeword CW, read from one bank array, from the I/O gating circuit 290. In an embodiment, the error correction circuit 400 performs an ECC decoding on the main data MD based on the parity data in the codeword CW, corrects a single bit error in the main data MD to generate corrected data main data and provides the corrected main data to the data I/O buffer 299.

In addition, the error correction circuit 400 may perform a scrubbing operation on at least one neighbor memory region located adjacently to the first memory region when the scrubbing controller 460 detects an intensive access to the first memory region of the memory cell array 300. For example, the scrubbing controller 460 may detect an intensive access when the number of reads and/or writes to the first memory region exceed a reference number during a given time internal. In an embodiment, the error correction circuit 400 performs the scrubbing operation sequentially on each of a plurality of sub-pages of a page corresponding to the at least one neighbor memory region. During the scrubbing, the error correction circuit 400 reads a first unit of data including a main data and a parity data from each of the sub-pages, corrects at least one bit error in the first unit of data using the parity data to generate a corrected first unit of data and writes back the corrected first unit of data into a memory location of each of the sub-pages.

The control logic circuit 210a may control operations of the semiconductor memory device 200a. For example, the control logic circuit 210a may generate control signals for the semiconductor memory device 200a to perform a write operation or a read operation. The control logic circuit 210a includes a command decoder 211 that decodes a command CMD received from the memory controller 100 and a mode register 212 that sets an operation mode of the semiconductor memory device 200a.

For example, the command decoder 211 may generate the control signals corresponding to the command CMD by decoding a write enable signal (/WE), a row address strobe signal (/RAS), a column address strobe signal (/CAS), a chip select signal (/CS), etc. The control logic circuit 210a may generate a first control signal CTL1 to control the I/O gating circuit 290, a second control signal CTL2 to control the error correction circuit 400 and a third control signal CTL3 to control the scrubbing controller 460. In addition, the control logic circuit 210a may provide the scrubbing request signal generator 490 with a mode signal MS designating a scrubbing mode.

When the scrubbing controller 460 detects the intensive access to the first memory region of the memory cell array 300, the scrubbing controller 460 provides a first detection signal DET1 to the control logic circuit 210a and the scrubbing request signal generator 490. The first detection signal DET1 may indicate that an intensive access has occurred. The control logic circuit 210a may control the I/O gating circuit 290 and the error correction circuit 400 to perform the scrubbing operation on the at least one neighbor memory region in response to the first detection signal DET1. In addition, the scrubbing controller 460 may provide the row decoder 260 with at least one victim address VCT_ADDR1 and VCT_ADDR2 of the at least one neighbor memory region. The at least one victim address VCT_ADDR and VCT_ADDR2 may correspond to addresses of rows of data that are adjacent to a row of data in which the intensive access has occurred.

The error correction circuit 400 performs an ECC decoding on the at least one neighbor memory region designated by the at least one victim address VCT_ADDR1 and VCT_ADDR2 to correct a bit error therein to generate corrected data and writes back the corrected data into a memory location corresponding to the first unit of data. When the correction circuit 400 performs an ECC decoding on the at least one neighbor memory region, the error correction circuit 400 provides an error generation signal EGS to the scrubbing controller 460 whenever the error correction circuit 400 detects a bit error in the first unit of data.

When the number of detected bit errors of the at least one neighbor memory region reaches a reference value, the scrubbing controller 460 provides a second detection signal DET2 to the scrubbing request signal generator 490 and the scrubbing request signal generator 490 provides the scrubbing request signal SRS to the memory controller 100 immediately through the separate pin 204 according to the mode signal MS in response to one of the first detection signal DET1 and the second detection signal DET2.

When the mode signal MS designates a first scrubbing mode, the scrubbing request signal generator 490 transmits the scrubbing request signal SRS to the memory controller 100 in response to the first detection signal DET1. When the mode signal MS designates a second scrubbing mode, the scrubbing request signal generator 490 transmits the scrubbing request signal SRS to the memory controller 100 in response to the second detection signal DET2. In an embodiment, the mode signal MS is provided by the control circuit 210a or the memory controller 100.

The memory controller 100 issues a scrubbing command to the semiconductor memory device 200a and the semiconductor memory device 200a performs the scrubbing operation immediately in response to the scrubbing command.

The scrubbing command constitutes signals different from signals for a read command designating a read operation or a write command designating a write operation of the semiconductor memory device 200a. For example, the scrubbing command, the read command, and the write command have different formats so that the command decoder 211 can distinguish them from one another, and operate accordingly.

FIGS. 4A to 4E are circuit diagrams of examples of the memory cell shown in FIG. 3, according to exemplary embodiments of the inventive concept.

Figure 4A:
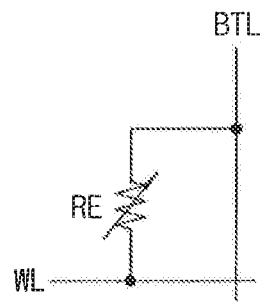
FIGS. 4A to 4E are circuit diagrams of examples of the memory cell shown in FIG. 3, according to exemplary embodiments of the inventive concept.
Figure 4B:
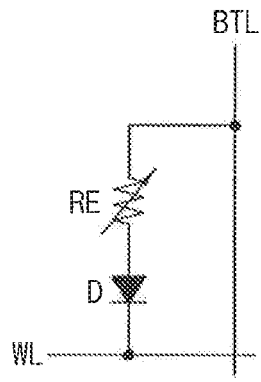
Figure 4C:
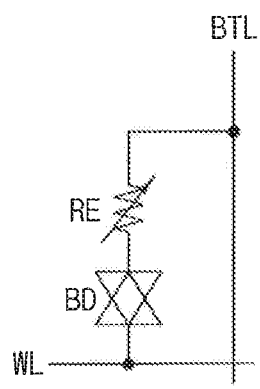
Figure 4D:
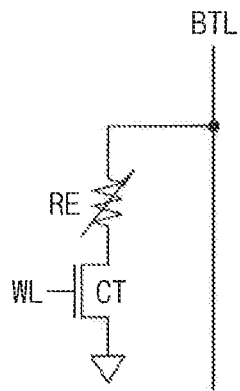
Figure 4E:
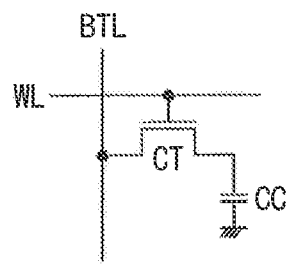

FIGS. 4A to 4D illustrate memory cells MC which are implemented with resistive type memory cells and FIG. 4E illustrates a memory cell MC which is implemented with a dynamic memory cell.

FIG. 4A illustrates a resistive type memory cell without a selection element, while FIGS. 4B to 4D show resistive type memory cells each comprising a selection element.

Referring to FIG. 4A, a memory cell MC includes a resistive element RE connected to a bit-line BTL and a word-line WL. Such a resistive memory cell having a structure without a selection element may store data when a voltage is applied across the bit-line BL and the word-line WL.

Referring to FIG. 4B, a memory cell MC includes a resistive element RE and a diode D. The resistive element RE may include a resistive material for data storage. The diode D may be a selection element (or switching element) that supplies current to the resistive element RE or cuts off the current supply to resistive element RE according to a bias of a word-line WL and a bit-line BTL. The diode D is coupled between the resistive element RE and word-line WL, and the resistive element RE is coupled between the bit-line BTL and the diode D. Positions of the diode D and the resistive element RE may be interchanged. For example, the diode D may be connected between the resistive element RE and the bit line BTL. The diode D may be turned on or turned off by application of a word-line voltage to the word-line WL. Thus, a resistive memory cell may be not driven when a voltage of a constant level or higher is supplied to an unselected word-line WL.

Referring to FIG. 4C, a memory cell MC includes a resistive element RE and a bidirectional diode BD. The resistive element R may include a resistive material for data storage. The bidirectional diode BD is coupled between the resistive element RE and a word-line WL, and the resistive element RE is coupled between a bit-line BTL and bidirectional diode BD. Positions of the bidirectional diode BD and the resistive element RE may be interchanged. For example, the bidirectional diode BD may be connected between the resistive element R and the bit-line BTL. The bidirectional diode BD may block leakage current flowing to an unselected semiconductor memory cell.

Referring to FIG. 4D, a memory cell MC includes a resistive element RE and a transistor CT. The transistor CT may be a selection element (or switching element) that supplies current to the resistive element RE or cuts off the current supply to the resistive element RE according to a voltage applied to a word-line WL. The transistor CT is coupled between the resistive element RE and a word-line WL, and the resistive element RE is coupled between a bit-line BTL and the transistor CT. Positions of the transistor CT and the resistive element RE may be interchanged. For example, the transistor CT may be connected between the resistive element RE and the bit line BTL. The semiconductor memory cell may be selected or unselected depending on whether the transistor CT driven by word-line WL is turned on or turned off. For example, the word-line WL is connected to a gate of the transistor CT so that a word-line voltage can be applied to turn on or turn off the transistor CT. The transistor CT may be connected between a ground voltage and the resistive element RE.

Referring to FIG. 4E, a memory cell MC includes a cell capacitor CC and a transistor CT. The transistor CT may be a selection element (or switching element) that connects/disconnects a cell capacitor CC to/from a bit-line BTL according to a voltage of a word-line WL. The transistor CT is coupled between the cell capacitor CC, a word-line WL and a bit-line BTL, and the cell capacitor CC is coupled between the transistor CT and a plate voltage.

Figure 5:
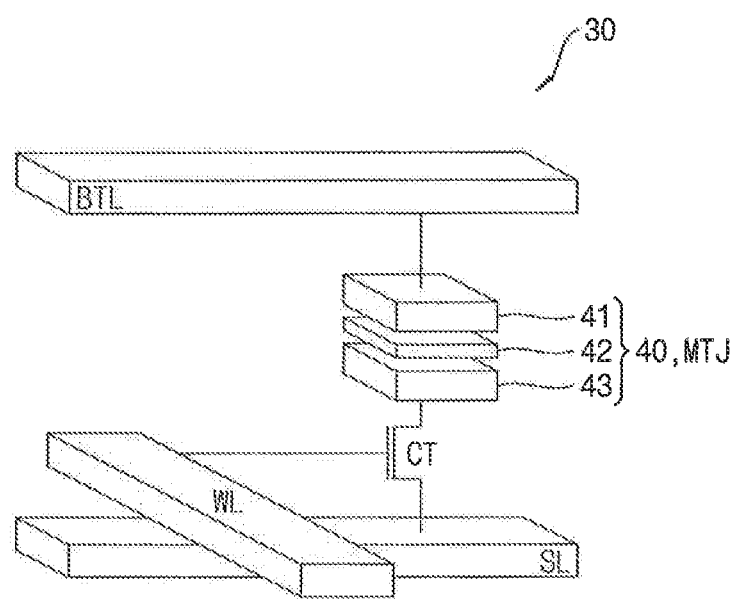
FIG. 5 illustrates an example of the memory cell (referred to as STT-MRAM cell) shown in FIG. 3, according to an exemplary embodiment of the inventive concept.

FIG. 5 illustrates an example of the memory cell (referred to as STT-MRAM cell) shown in FIG. 3, according to exemplary embodiment of the inventive concept.

Referring to FIG. 5, an STT-MRAM cell 30 includes a MTJ element 40 and a cell transistor CT. A gate of the cell transistor CT is connected to a word-line WL and one electrode of the cell transistor CT is connected through the MTJ 40 to a bit-line BTL. Also, the other electrode of the cell transistor CT is connected to a source line SL.

The MTJ element 40 includes the free layer 41, the pinned layer 43, and a tunnel layer 42 disposed between the free layer 41 and the pinned layer 43. A magnetization direction of the pinned layer 43 may be fixed, and a magnetization direction of the free layer 41 may be parallel to or anti-parallel to the magnetization direction of the pinned layer 43 according to written data. For example, an anti-ferromagnetic layer (not shown) may be further provided to fix the magnetization direction of the pinned layer 43.

A write operation of the STT-MRAM cell 30 may be performed by applying a logic high voltage to the word-line WL to turn on the cell transistor CT. A program current, for example, a write current is applied to the bit-line BTL and the source line SL. A direction of the write current is determined by a logic state of the MTJ element 40.

A read operation of the STT-MRAM cell 30 may be performed by applying a logic high voltage to the word-line WL to turn on the cell transistor CT, and a read current is supplied to the bit-line BTL and the source line SL. Accordingly, a voltage developed at both ends of the MTJ element 40 is detected by the sense amplifier 285a, and is compared with a reference voltage to determine a logic state of the MTJ element 40. Accordingly, data stored in the MTJ element 40 may be detected.

Figure 6A:
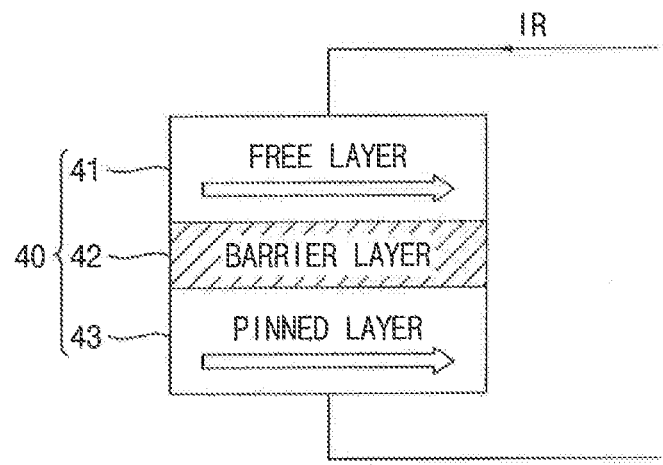
FIGS. 6A and 6B illustrate a magnetization direction according to data written to the MTJ element shown in FIG. 5.
Figure 6B:
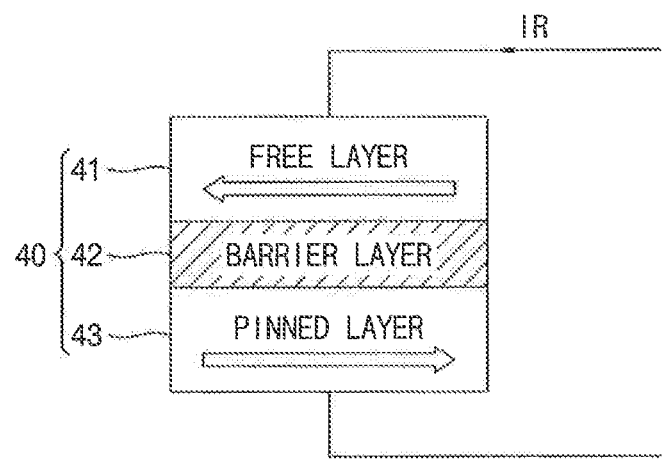

FIGS. 6A and 6B illustrate a magnetization direction according to data written to the MTJ element shown in FIG. 5.

A resistance value of the MTJ element 40 may vary according to a magnetization direction of the free layer 41. When a read current IR flows through the MTJ 40, a data voltage is output according to the resistance value of the MTJ element 40. Since the read current IR is much smaller than a write current, a magnetization direction of the free layer 41 is not changed by the read current IR.

Referring to FIG. 6A, a magnetization direction of the free layer 41 and a magnetization direction of the pinned layer 43 of the MTJ element 40 are parallel. Accordingly, the MTJ element 40 may have a low resistance value. In this case, the MTJ element 40 may read data '0'.

Referring to FIG. 6B, a magnetization direction of the free layer 41 and a magnetization direction of the pinned layer 43 of the MTJ element 40 are anti-parallel. Accordingly, the MTJ element 40 may have a high resistance value. In this case, the MTJ element 40 may read data '1'.

Although the free layer 41 and the pinned layer 43 of the MTJ element 40 are horizontal magnetic layers, example embodiments are not limited thereto and the free layer 41 and the pinned layer 43 may be, for example, vertical magnetic layers.

Figure 7:
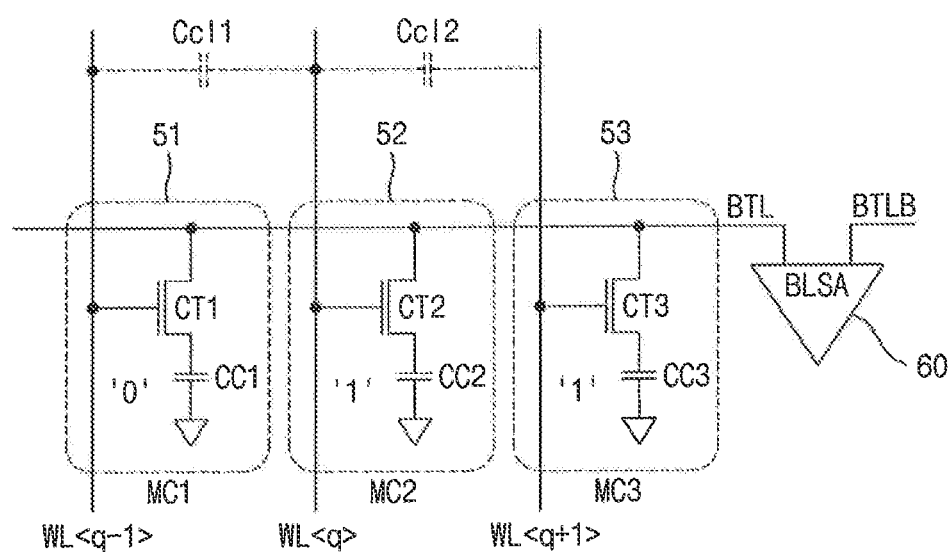
FIG. 7 is a circuit diagram illustrating disturbance between memory cells of a semiconductor memory device.

FIG. 7 is a circuit diagram illustrating a disturbance between memory cells of a semiconductor memory device.

In FIG. 7, it is assumed that each of the memory cells is implemented with the dynamic memory cell of FIG. 4E.

Referring to FIG. 7, a part of the semiconductor memory device includes memory cells 51, 52, and 53 and a bit-line sense amplifier 60.

It is assumed that each of the memory cells 51, 52, and 53 is connected to the same bit-line BTL. In addition, the memory cell 51 is connected to a word-line WL<q−1>, the memory cell 52 is connected to a word-line WL<q>, and the memory cell 53 is connected to a word-line WL<q+1>. As shown in FIG. 7, the word-lines WL<q−1> and WL<q+1> are located adjacent to the word-line WL<q>. The memory cell 51 includes an access transistor CT1 and a cell capacitor CC1. A gate terminal of the access transistor CT1 is connected to the word-line WL<q−1> and its one terminal is connected to the bit-line BTL. The memory cell 52 includes an access transistor CT2 and a cell capacitor CC2. A gate terminal of the access transistor CT2 is connected to the word-line WL<q> and its one terminal is connected to the bit-line BTL. Also, the memory cell 53 includes an access transistor CT3 and a cell capacitor CC3. A gate terminal of the access transistor CT3 is connected to the word-line WL<q+1> and its one terminal is connected to the bit-line BTL.

The bit-line sense amplifier 60 may include an N sense amplifier discharging a low level bit line among bit lines BTL and BTLB and a P sense amplifier charging a high level bit line among the bit lines BTL and BTLB.

During a refresh operation, the bit-line sense amplifier 60 rewrites data stored through the N sense amplifier or the P sense amplifier PSA in a selected memory cell. During a read operation or a write operation, a select voltage (for example, Vpp) is provided to the word-line WL<q>. Then, due to a capacitive coupling effect, a voltage of adjacent word-lines WL<q−1> and WL<q+1> rises even when no select voltage is applied. Such capacitive coupling is indicated with parasitic capacitances Ccl1 and Ccl2. During no refresh operation, when the word-line WL<q> is accessed repeatedly, charges stored in the cell capacitors CC1 and CC3 of the memory cells 51 and 53 connected to the word-lines WL<q−1> and WL<q+1> may leak gradually. In this case, the reliability of a logic '0' stored in the cell capacitor CC1 and a logic '1' stored in the cell capacitor CC3 may not be guaranteed. Therefore, a scrubbing operation may need to be performed on the memory cells at an appropriate time.

When an intensive access to the memory cells connected to the word-line WL<q> occurs, the semiconductor memory device 200a performs the scrubbing operation on the memory cells connected to the adjacent word-lines WL<q−1> and WL<q+1> to enhance data retention reliability.

Figure 8:
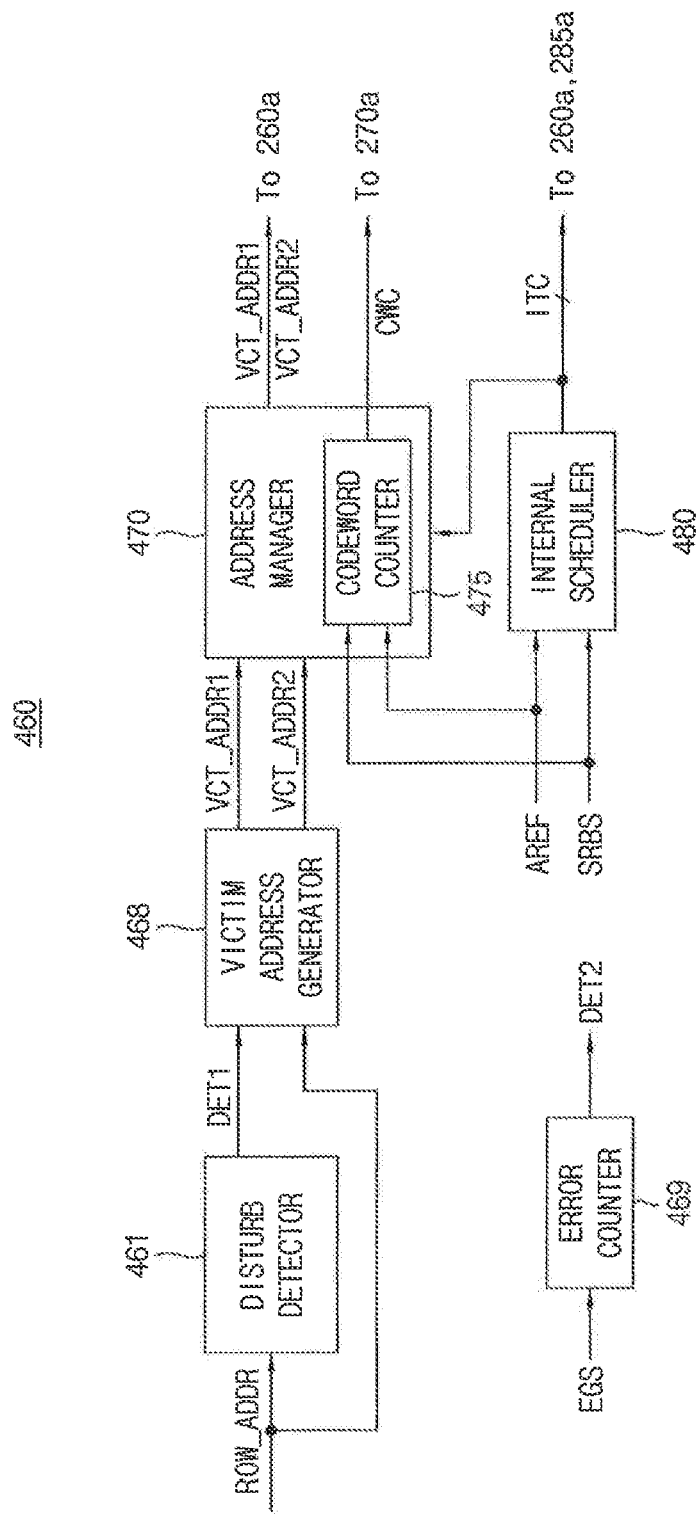
FIG. 8 is a block diagram illustrating the scrubbing controller in the semiconductor memory device of FIG. 3 according to an exemplary embodiment of the inventive concept.

FIG. 8 is a block diagram illustrating the scrubbing controller in the semiconductor memory device of FIG. 3 according to an exemplary embodiment of the inventive concept.

Referring to FIG. 8, the scrubbing controller 460 includes a disturbance detector 461 (e.g., a circuit), a victim address generator 468, an error counter 469, an address manager 470 (e.g., a circuit) and an internal scheduler 480 (e.g., a circuit). The address manager 470 includes a codeword counter 475.

The disturbance detector 470 counts a number of accesses to the first memory region based on the row address ROW_ADDR and generates the first detection signal when the number of the accesses counted reaches a first reference value during a reference (or predetermined) interval. For example, the first memory region may correspond to memory cells connected to a row of a bank of the memory 300 having the row address ROW_ADDR input to the disturbance detector 4601.

The victim address generator 468 generates at least one victim address VCT_ADDR1 and VCT_ADDR2 in response to the first detection signal DET1. The at least one victim address VCT_ADDR1 and VCT_ADDR2 are row addresses designating a second memory region and a third memory region which are located adjacent to the first memory region. The victim address generator 468 may provide the at least one victim address VCT_ADDR1 and VCT_ADDR2 to the address manager 470. For example, the first victim address VCT_ADDR1 may correspond to a row address above the row address ROW_ADDR and the second victim address VCT_ADDR2 may correspond to a row address below the row address ROW_ADDR.

The internal scheduler 480 generates an internal timing control signal ITC in response to one of an auto refresh signal AREF and a scrubbing signal SRBS and provides the internal timing control signal ITC to the address manager 470, the row decoder 260*a*, the column decoder 285*a* and the error correction circuit 400. The control logic circuit 210 applies the auto refresh signal AREF to the internal scheduler 480 whenever an auto refresh (e.g., a auto refresh command) is received from the memory controller 100 and the control logic circuit 210 applies the scrubbing signal SRBS to the internal scheduler 480 whenever the scrubbing command is received from the memory controller 100.

The address manager 470 receives the internal timing control signal ITC and provides the row decoder 260*a* with the at least one victim address VCT_ADDR1 and VCT_ADDR2 according to timing specified by the internal timing control signal ITC.

The codeword counter 475 increases a codeword counting value CWC and provides the codeword counting value CWC to the column decoder 270*a* whenever the codeword counter 475 receives the auto refresh signal AREF such that some sub-pages to be scrubbed are sequentially selected during a refresh interval tRFC in which a page is refreshed. The counter 475 increases the codeword counting value CWC and provides the codeword counting value CWC to the column decoder 270*a* when the codeword counter 475 receives the scrubbing signal SRBS such that sub-pages of a first page corresponding to the victim address VCT_ADDR1 and sub-pages of a second page corresponding to the victim address VCT_ADDR2 are consecutively selected respectively.

When the error correction circuit 400 performs the scrubbing operation on the sub-pages of the first page corresponding to the victim address VCT_ADDR1 and the sub-pages of the second page corresponding to the victim address VCT_ADDR2 respectively, the error counter 469 counts the error generation signal EGS that the error correction circuit 400 generates whenever an error occurs (or the error correction circuit 400 detects a bit error) and the error counter 469 provides the second detection signal DET2 to the scrubbing request signal generator 490 when the counted number of the error generation signal EGS of one of the first page and the second page reaches a second reference value. When the error counter 469 provides the second detection signal DET2 to the scrubbing request signal generator 490, the error counter 469 may be reset automatically.

Figure 9:
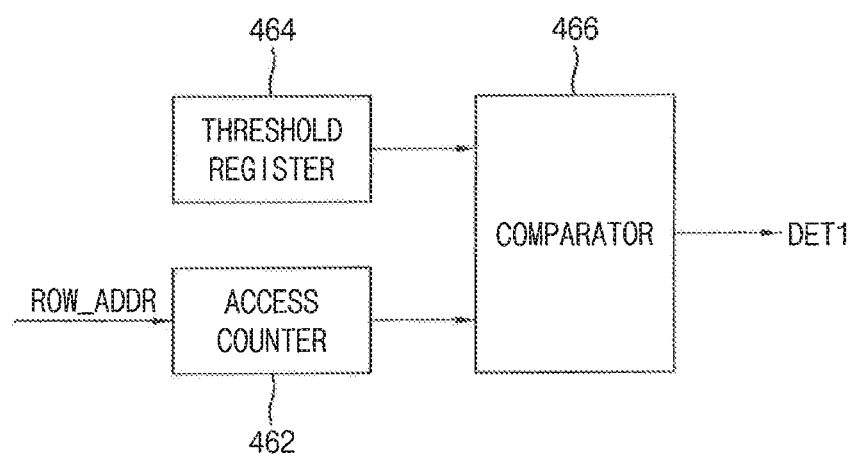
FIG. 9 is a block diagram illustrating the disturbance detector in the scrubbing controller of FIG. 8.

FIG. 9 is a block diagram illustrating the disturbance detector in the scrubbing controller of FIG. 8 according to an exemplary embodiment of the inventive concept.

Referring to FIG. 9, the disturbance detector 461 includes an access counter 462, a threshold register 464 and a comparator 466.

The access counter 462 counts a number of accesses to a specified address (or a specified memory region) based on the row address ROW_ADDR. For example, the access counter 462 may count a number of accesses to a specified word-line. The number of accesses may be counted on a specific word-line or a word-line group including at least two word-lines. Moreover, a count of the number of accesses may be performed by a specific block unit, a bank unit, or a chip unit.

The threshold register 464 may store a maximum disturbance occurrence count that guarantees the reliability of data in a specific word-line or a memory unit. For example, a threshold (or a first reference value) on one word-line may be stored in the threshold register 464. Alternatively, a threshold on one word line group, one block, one bank unit, or one chip unit may be stored in the threshold register 464.

The comparator 466 compares the threshold stored in the threshold register 464 with the number of accesses to a specific memory region counted by the access counter 462. If there is a memory region where the counted number of accesses reaches the first reference value, the comparator 466 generates the first detection signal DET1. The comparator 466 provides the first detection signal DET1 to the control logic circuit 210.

Figure 10:
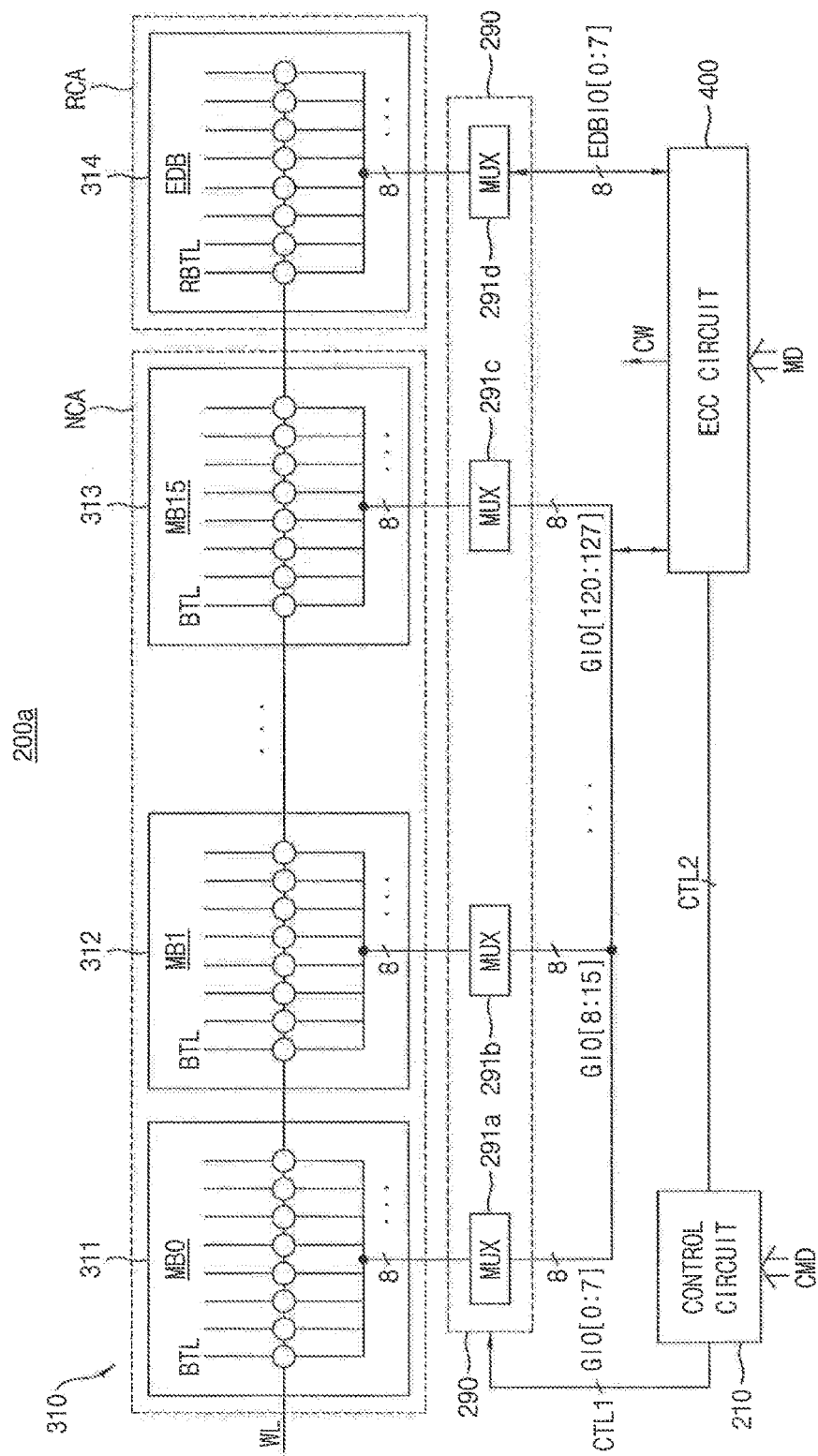
FIG. 10 illustrates a portion of the semiconductor memory device of FIG. 3 in a normal mode.

FIG. 10 illustrates a portion of the semiconductor memory device of FIG. 3 in a normal mode.

In FIG. 10, the control logic circuit 210, the first bank array 310, the I/O gating circuit 290, and the error correction circuit 400 are illustrated. FIG. 10 illustrates the portion of the semiconductor memory device 200*a* in a write operation of a normal mode.

Referring to FIG. 10, the first bank array 310 includes a normal cell array NCA and a redundancy cell array RCA. The normal cell array NCA includes a plurality of first memory blocks MB0~MB15, i.e., 311~313, and the redundancy cell array RCA includes at least a second memory block 314. The first memory blocks 311~313 are memory blocks determining a memory capacity of the semiconductor memory device 200*a*. The second memory block 314 is for ECC and/or redundancy repair. Since the second memory block 314 for ECC and/or redundancy repair is used for ECC, data line repair and block repair to repair 'fail' cells (e.g., cells that are malfunctioning) generated in the first memory blocks 311~313, the second memory block 314 is also referred to as an EDB block.

In each of the first memory blocks 311~313, a plurality of first memory cells are arranged in rows and columns. In the second memory block 314, a plurality of second memory cells are arranged in rows and columns.

In the first memory blocks 311~313, rows may be formed, for example, of 8K word-lines WL and columns may be formed, for example, of 1K bit-lines BTL. The first memory cells connected to intersections of the word-lines WL and the bit-lines BTL may be dynamic memory cells or resistive type memory cells. In the second memory block 314, rows may be formed, for example, of 8K word-lines WL and columns may be formed, for example, of 1K bit-lines BTL. The second memory cells connected to intersections of the word-lines WL and the bit-lines RBTL may be dynamic memory cells or resistive type memory cells.

The I/O gating circuit 290 includes a plurality of switching circuit 291*a*~291*d* respectively connected to the first memory blocks 311~313 and the second memory block 314. In the semiconductor memory device 200*a*, bit lines corresponding to data of a burst length (BL) may be simultaneously accessed to support the BL indicating the maximum number of column positions that is accessible. For example, if the BL is set to 8, data bits may be set to 128 bits.

The error correction circuit 400 may be connected to the switching circuits 291*a*~291*d* through first data lines GIO [0:127] and second data lines EDBIO[0:7].

The control logic circuit 210 may decode the command CMD to generate the first control signal CTL1 for controlling the switching circuits 291a~291d and the second control signal CTL2 for controlling the error correction circuit 400.

When the command CMD is a write command, the error correction circuit 400 encodes the main data MD to generate a codeword CW including the main data MD and parity data associated with the main data MD. The I/O gating circuit 290 stores the main data MD in the first memory blocks 311~313 and stores the parity data in the second memory block 314. The parity data may be used to error correct the associated main data MD.

Figure 11:
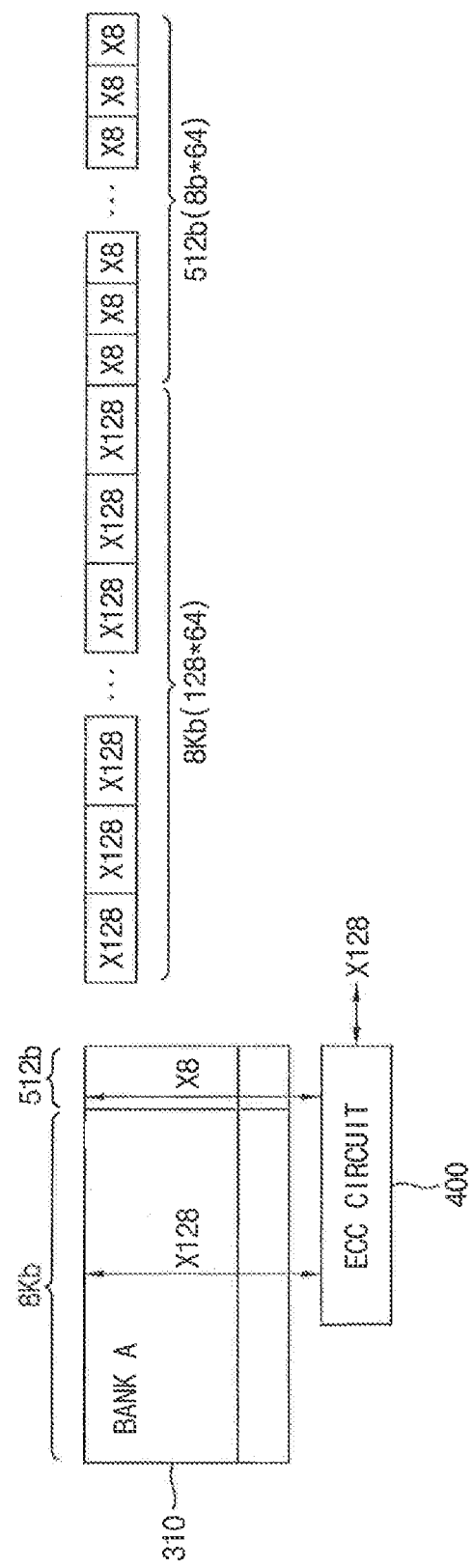
FIG. 11 illustrates a bank array and the error correction circuit shown in the semiconductor memory device of FIG. 3.

FIG. 11 illustrates a bank array and the error correction circuit shown in the semiconductor memory device of FIG. 3.

In FIG. 11, the first bank array 310 is illustrated for convenience, however, the details discussed herein related to the first bank array 310 may equally apply to the other bank arrays 320, 330 and 340.

Referring to FIG. 11, each page of the first bank array 310 has a size of 8 Kb and each sub-page of the page has a size of 128 b. Therefore, FIG. 11 illustrates 64 sub-pages. A parity data of 8 b is stored for each sub-page. Data from each sub-page of 128 b and corresponding parity data of 8 b are sequentially read and provided to the error correction circuit 400. A Hamming code may be used by the error correction circuit 400 for error detection and correction. The ECC method and a codeword length used during read/write operations may also be used for the scrubbing operation according to exemplary embodiments.

Figure 12:
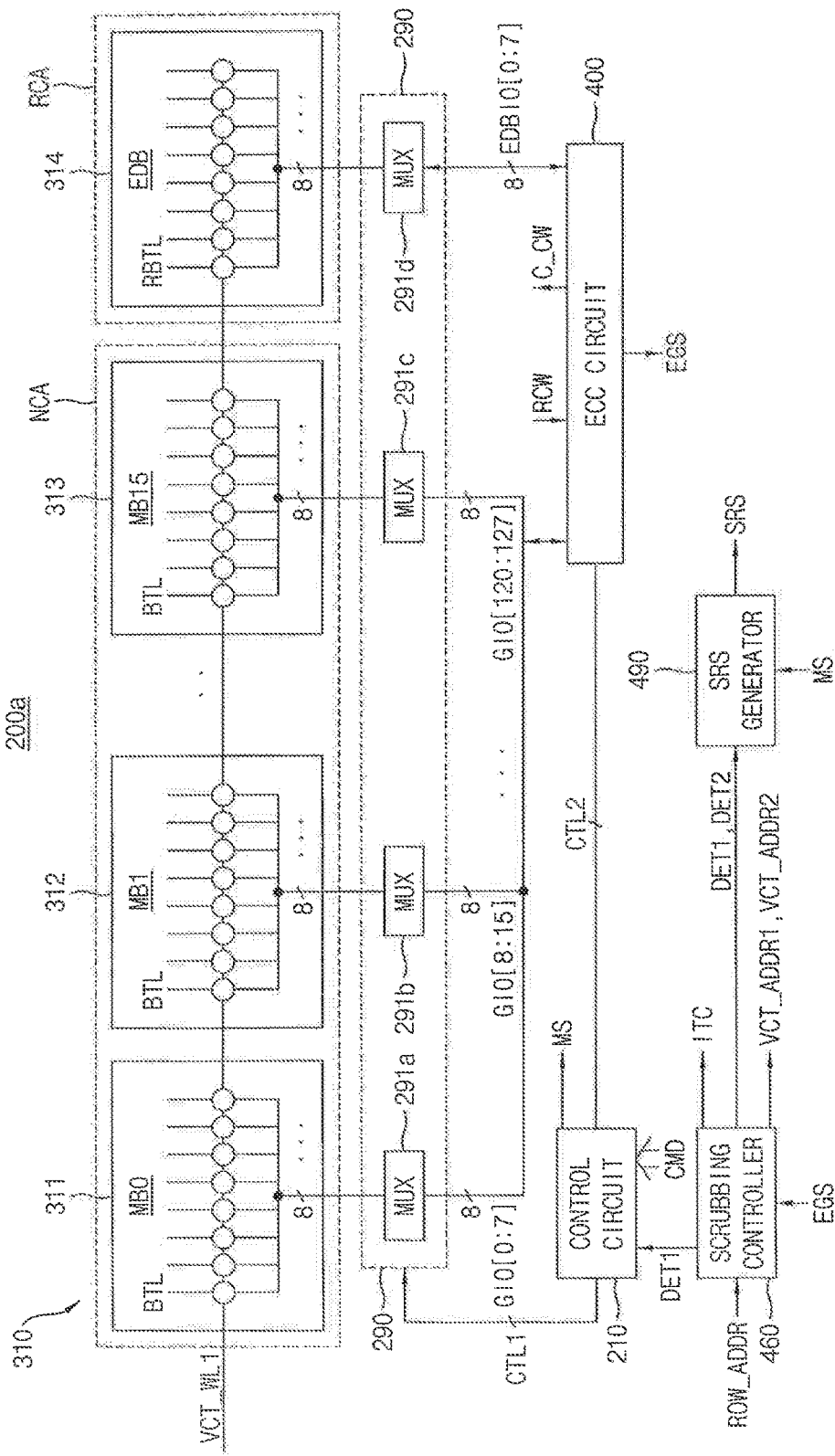
FIG. 12 illustrates related components in the semiconductor memory device of FIG. 3 when intensive access to a specified memory region occurs.

FIG. 12 illustrates related components in the semiconductor memory device of FIG. 3 when the intensive access to a specified memory region occurs.

FIG. 12 illustrates the control logic circuit 210, the first bank array 310, the I/O gating circuit 290, the error correction circuit 400, the scrubbing controller 460 and the scrubbing request signal generator 490 in a scrubbing mode. In addition, a description is provided on a scrubbing operation performed on the memory cells coupled to a victim wordline VCT_WL1 designated by the victim address VCT_ADDR1.

The scrubbing controller 460 provides the first detection signal DET1 to the control logic circuit 210 based on the row address ROW_ADDR when the first memory region is intensively accessed and the counted number of accesses to the first memory region reaches the first reference value. The scrubbing controller 460 generates the victim addresses VCT_ADDR1 and VCT_ADDR2 based on the row address ROW_ADDR and generates the internal timing control signal ITC. The scrubbing controller 460 provides the internal timing control signal ITC to the error correction circuit 400 and the error correction circuit 400 performs the scrubbing operation on sub-pages of the second and third pages designated by the victim addresses VCT_ADDR1 and VCT_ADDR2. The control logic circuit 210 applies the auto refresh signal to the scrubbing controller 460 whenever the control logic circuit 210 receives the auto refresh command and the scrubbing controller 460 generates the internal timing control signal ITC based on the auto refresh signal.

The error correction circuit 400 may apply the error generation signal EGS to the scrubbing controller 460 whenever an error occurs in each of the sub-pages while the error correction circuit 400 performs the scrubbing operation. The scrubbing controller 460 counts a number of error occurrences in the first page or the second page based on the error generation signal EGS, activates the second detection signal DET2 when the counted number of error occurrences reaches a second reference value and applies the second detection signal DET2 to the scrubbing request signal generator 490.

As mentioned above, the SRS Generator 490 may transmit the scrubbing request signal SRS to the memory controller 100 immediately in response to one of the first detection signal DET1 and the second detection signal DET2 according to the mode signal MS. The memory controller 100 applies the scrubbing command to the control logic circuit 210 in response to the scrubbing request signal SRS.

The control logic circuit 210 provides the scrubbing signal to the scrubbing controller 460 and the scrubbing controller 460 generates the internal timing control signal ITC in response to the scrubbing signal such that the scrubbing operation is consecutively applied to the sub-pages of the second page and the sub-pages of the third page.

Figure 13:
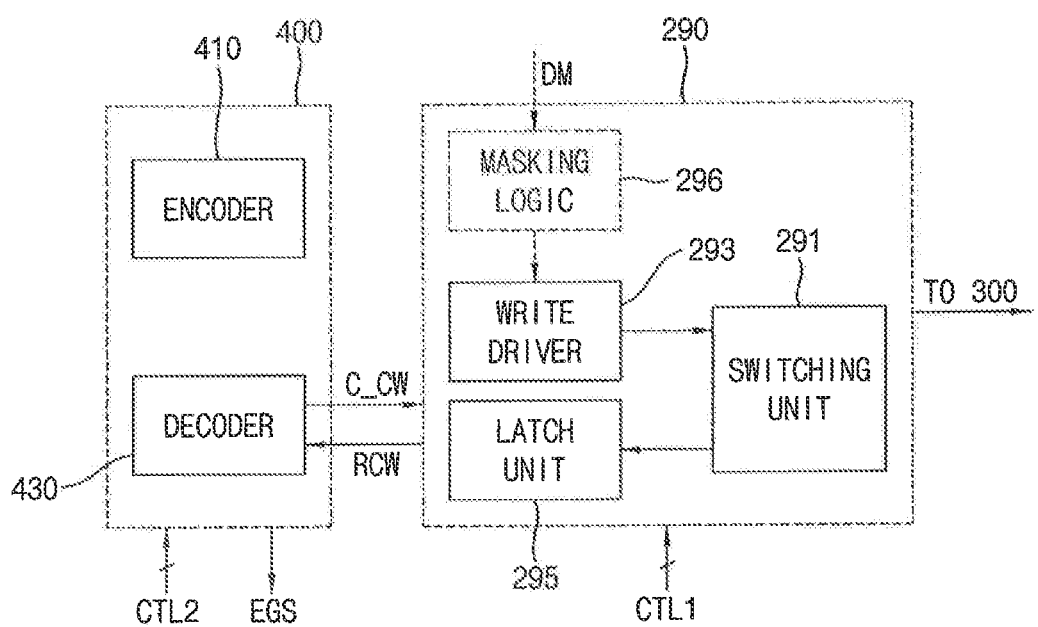
FIG. 13 illustrates the error correction circuit and the I/O gating circuit in the semiconductor memory device of FIG. 3 when the scrubbing operation is performed.

FIG. 13 illustrates the error correction circuit and the I/O gating circuit in the semiconductor memory device of FIG. 3 when the scrubbing operation is performed.

Referring to FIG. 13, the error correction circuit 400 includes an ECC encoder 410 and an ECC decoder 430. The I/O gating circuit 290 includes a switching unit 291, a write driver 293 and a latch unit 295. The I/O gating circuit 290 may further include a masking logic 296. The switching unit 291 may include the switches 291a~291d in FIGS. 10 and 12. The I/O gating circuit 290 may provide the ECC decoder 430 with the read codeword RCW read from a sub-page of a page in the memory cell array 300 in the scrubbing mode. The ECC decoder 430 may correct a bit error in the read codeword RCW using a parity data in the read codeword RCW to generate a corrected codeword C_CW and may provide the corrected codeword C_CW to the I/O gating circuit 290. The I/O gating circuit 290 receives the corrected codeword C_CW from the ECC decoder 430 and writes back the corrected data of a sub codeword into a memory location corresponding to the sub codeword into the sub-page. The error correction circuit 400 may provide the error generation signal EGS to the scrubbing controller 460 whenever an error occurs in the read codeword RCW while the error correction circuit 400 performs the scrubbing operation.

The ECC decoder 430 may perform the above-described scrubbing operation in response to the second control signal CTL2 in the scrubbing mode.

Figure 14:
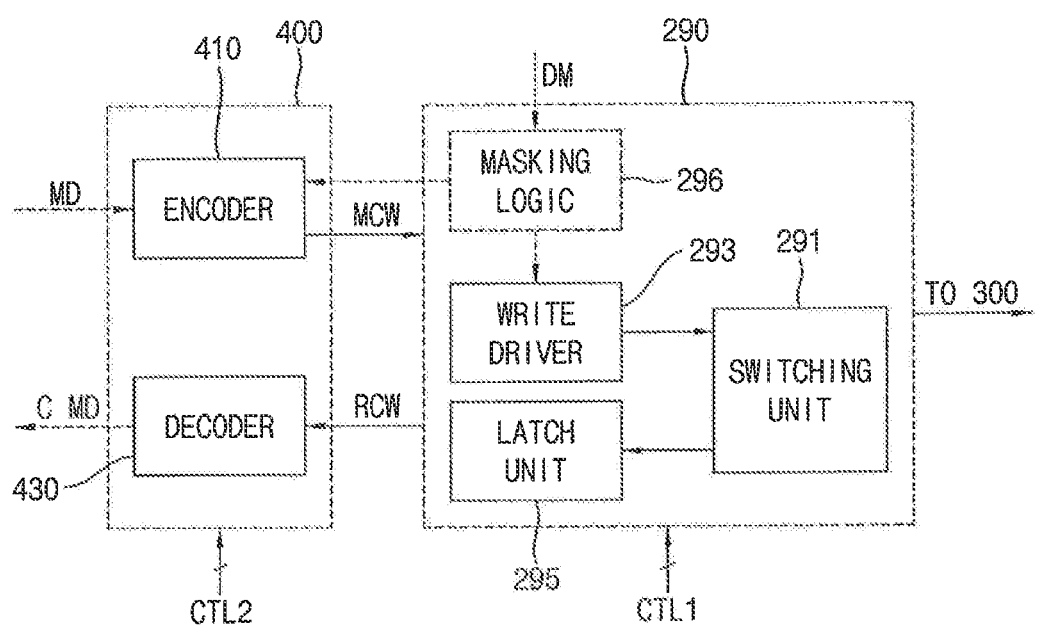
FIG. 14 illustrates the error correction circuit and the I/O gating circuit in the semiconductor memory device of FIG. 3 in the normal mode.

FIG. 14 illustrates the error correction circuit and the I/O gating circuit in the semiconductor memory device of FIG. 3 in the normal mode.

Referring to FIG. 14, in a read operation of the normal mode, the I/O gating circuit 290 may provide the ECC decoder 430 with the read codeword RCW read from a sub-page of a target page in the memory cell array 300. The ECC decoder 430 may correct a bit error in the read codeword RCW using a parity data in the read codeword RCW to generate corrected main data C_MD and may provide the corrected main data C_MD to the data I/O buffer 299.

In a write operation of the normal mode, the ECC encoder 410 may generate a write parity data based on the write main data MD and may provide the codeword CW including write main data MD and the write parity data to the I/O gating circuit 290.

The masking logic 296 controls the write driver 293 and the ECC encoder 410 to perform a masked write operation in response to the data mask signal DM from the memory controller 100 in a masked write operation.

Figure 15:
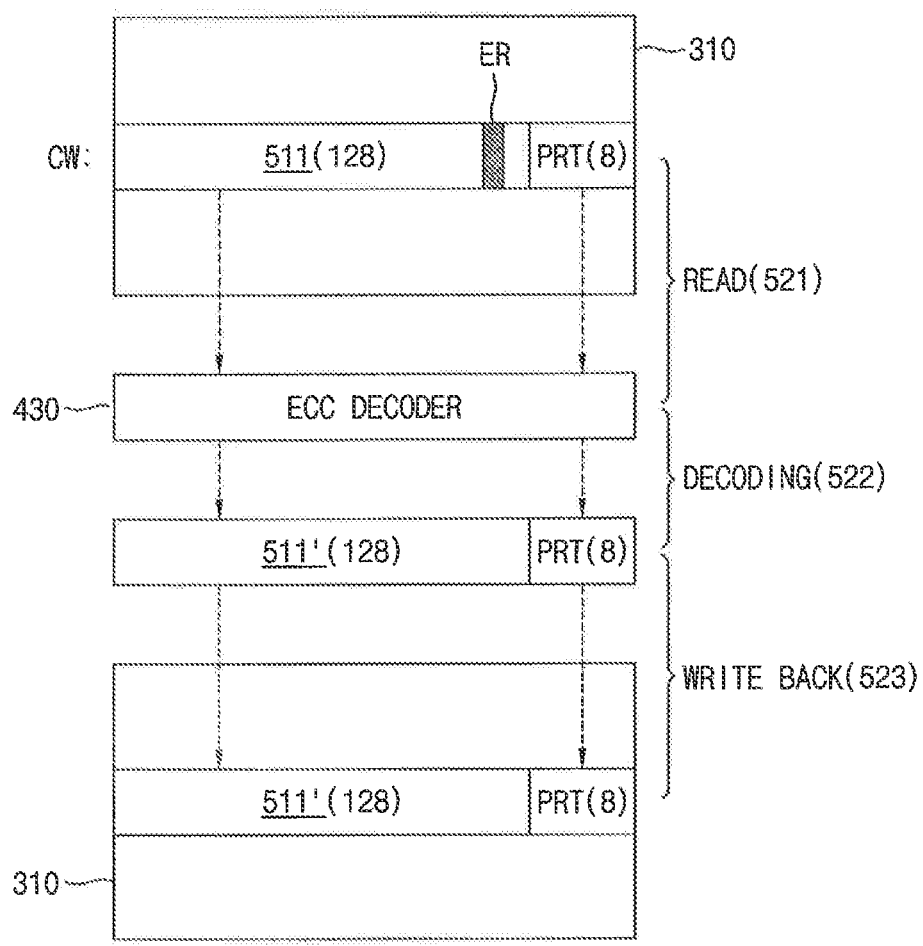
FIG. 15 illustrates that a scrubbing operation is performed on the neighbor memory region in the semiconductor memory device of FIG. 7.

FIG. 15 illustrates that a scrubbing operation is performed on the neighbor memory region in the semiconductor memory device of FIG. 7.

Referring to FIGS. 10, 13 and 15, when the scrubbing controller 460 detects the intensive accesses to the first memory region and applies the first detection signal DET1 to the control logic circuit 210, the I/O gating circuit 290 reads a first unit of a codeword including a 128-bit main data 511 and a 8-bit parity data PRT from a sub-page of the second page in the bank array 310 and the first unit of codeword CW is provided to the ECC decoder 430 as a reference numeral indicates 521. The main data 511 includes a one bit error ER. The ECC decoder 430 performs an ECC decoding on the first unit of codeword CW, corrects the bit error ER in the main data 511 to generate a corrected codeword CW and provides the corrected codeword including the corrected main data 511' and the parity data PRT to the I/O gating circuit 290 as a reference numeral indicates 522. The I/O gating circuit 290 may write back the corrected codeword into a memory location corresponding to the sub-page as a reference numeral indicates 523.

Figure 16:
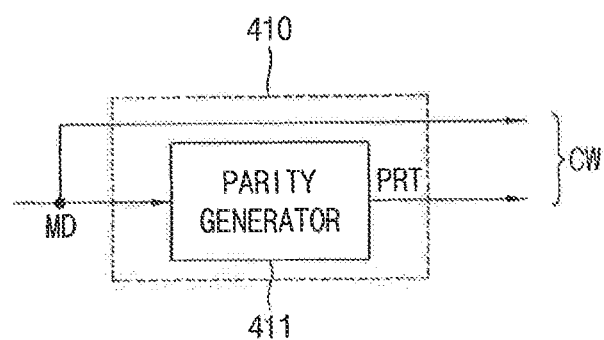
FIG. 16 illustrates the ECC encoder in the error correction circuit in FIG. 14.

FIG. 16 illustrates the ECC encoder in the error correction circuit in FIG. 14.

Referring to FIG. 16, the ECC encoder 410 includes a parity generator 411. The parity generator 411 performs an ECC encoding on the write data MD to generate the parity data PRT in a write operation and provides the I/O gating circuit 290 with the codeword CW including the write data MD and the parity data PRT.

Figure 17:
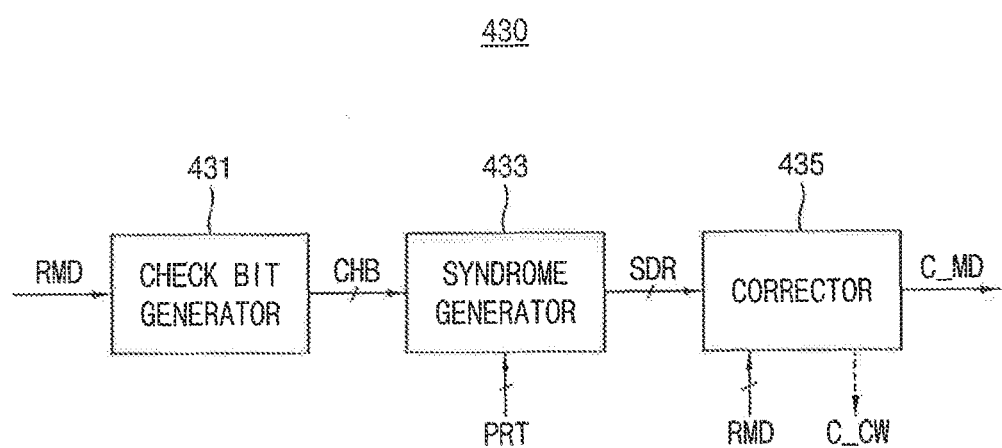
FIG. 17 illustrates the ECC decoder in the error correction circuit in FIGS. 13 and 14.

FIG. 17 illustrates the ECC decoder in the error correction circuit in FIGS. 13 and 14 according to an exemplary embodiment of the inventive concept.

Referring to FIG. 17, the ECC decoder 430 includes a check bit generator 431, a syndrome generator 433 and a data corrector 435.

The check bit generator 431 generates check bits CHB based on the read data RMD. The syndrome generator 433 generates a syndrome data SDR based on the check bits CHB and the parity data PRT included in the read codeword. The syndrome data SDR may indicate whether the read data RMD includes at least one bit error and may also indicate a position of the bit error. The data corrector 435 may correct the bit error in the read data RMD based on the syndrome data SDR, may provide the corrected codeword C_CW to the I/O gating circuit 290 in a scrubbing mode and may provide the corrected main data C_MD to the data I/O buffer 299 in a read operation.

Figure 18:
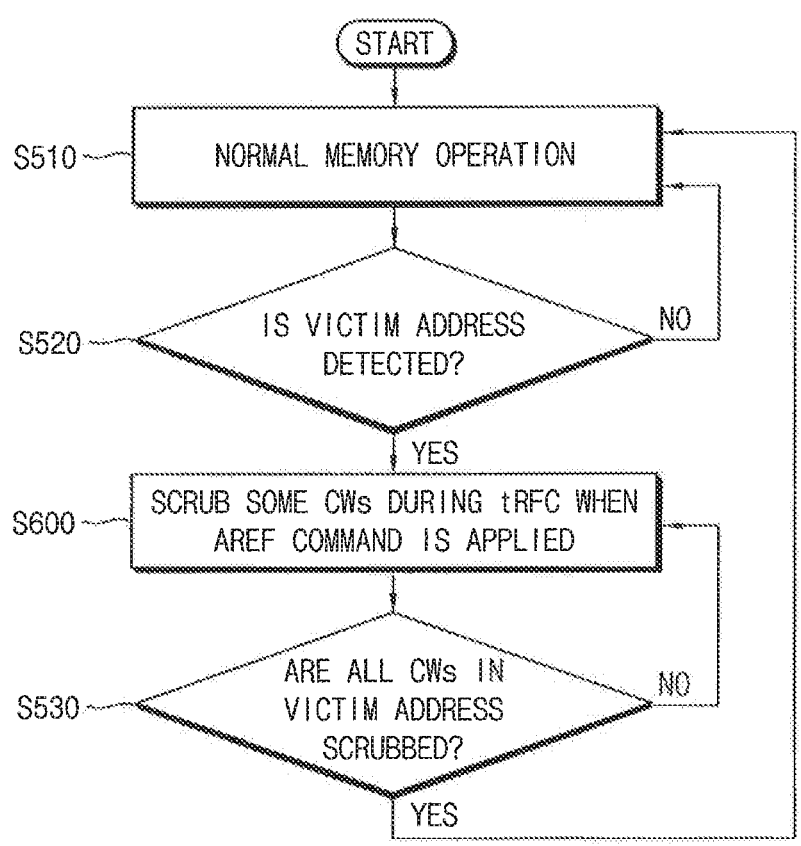
FIG. 18 is a flow chart illustrating a method of operating a semiconductor memory device according to an exemplary embodiment of the inventive concept.

FIG. 18 is a flow chart illustrating a method of operating a semiconductor memory device according to an exemplary embodiment of the inventive concept.

Referring to FIGS. 2, 3, and 7 through 18, in a method of operating a semiconductor memory device 200a that includes a memory cell array 300, an error correction circuit 400 and a scrubbing controller 460, the semiconductor memory device 200a performs a normal memory operation on the memory cell array 300 in response to a command from a memory controller 100 (S510). The normal memory operation may include one of a write operation, a read operation and a refresh operation. While the normal memory operation is being performed on the memory cell array 300, the scrubbing controller 460 counts the number of accesses to a first memory region of the memory cell array 300 to determine whether a disturbance on at least one neighbor memory region located adjacent to the first memory region reaches a reference value. The scrubbing controller 460 determines whether at least one victim address is detected due to the intensive accesses to the first memory region (S520).

When the victim address is detected, that is, when the counted number of accesses to the first memory region reaches the reference value (YES in S520), the error correction circuit 400 performs the scrubbing operation on some sub-pages of the at least one neighbor memory region whenever the auto refresh command is applied (S600). When the victim address is not detected, that is, when the counted number of accesses to the first memory region does not reach the reference value (NO in S520), the normal memory operation is performed on the memory cell array 300 (S510).

The scrubbing controller 460 determines whether the scrubbing operation is performed on all sub-pages of the at least one neighbor memory region designated by the victim address (S530). When the scrubbing operation is not performed on all sub-pages of the at least one neighbor memory region (NO in S530), the scrubbing operation is performed on other sub-pages (S600). When the scrubbing operation is performed on all sub-pages of the at least one neighbor memory region (YES in S530), the normal memory operation is performed on the memory cell array 300 in response to a command from the memory controller (S510).

Figure 19:
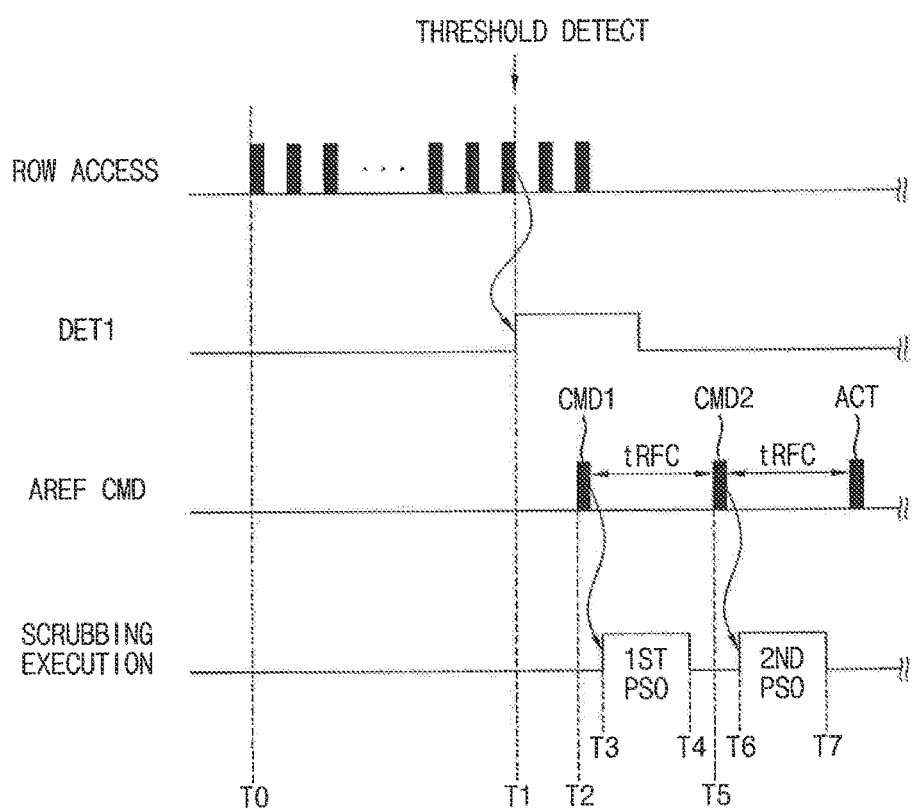
FIG. 19 is a timing diagram illustrating an example of the method of FIG. 18.

FIG. 19 is a timing diagram illustrating an example of the method of FIG. 18.

In FIG. 19, the semiconductor memory device 200a performs, for example, the scrubbing operation on the sub-pages of the at least one neighbor memory region whenever the auto refresh command AREF is received from the memory controller 100.

A time T0 represents a time when an operation for counting the number of accesses to the first memory region starts. The disturbance detector 461 of FIG. 8 starts an operation for counting the number of accesses on a specific memory region at the time T0. For example, it is assumed that the disturbance detector 461 counts the number of accesses on one row. The number of accesses on one row may be measured by counting the number of times an active command is applied.

At a time T1, when the counted number of accesses reaches a threshold (or, a first reference value), the disturbance detector 461 generates the first detection signal DET1 at the time T1. At a time T2, an auto refresh command CMD1 is applied to the semiconductor memory device 200a from the memory controller 100, the scrubbing controller 460 and the error correction circuit 400 performs a first scrubbing operation 1ST PSO on some portion of sub-pages of a second page adjacent the first memory region during a refresh cycle tRFC between times T3 and T4 in which a refresh operation is performed on one page of the memory cell array 300. At a time T5, an auto refresh command CMD2 is applied to the semiconductor memory device 200a from the memory controller 100, the scrubbing controller 460 and the error correction circuit 400 performs a second scrubbing operation 2ND PSO on other portions of sub-pages of the second page during the refresh cycle tRFC between times T6 and T7 in which a refresh operation is performed on another page of the memory cell array 300. The second scrubbing operation is completed at a time T7 when an active command ACT is applied to the semiconductor memory device 200a from the memory controller 100. The active command ACT may be applied to a word-line for enabling the word line to select a memory cell.

After the time T7, the scrubbing controller 460 and the error correction circuit 400 performs a scrubbing operation on some other portion of the sub-pages of the second page and some portion of sub-pages of a third page adjacent to the first memory region.

Figure 20:
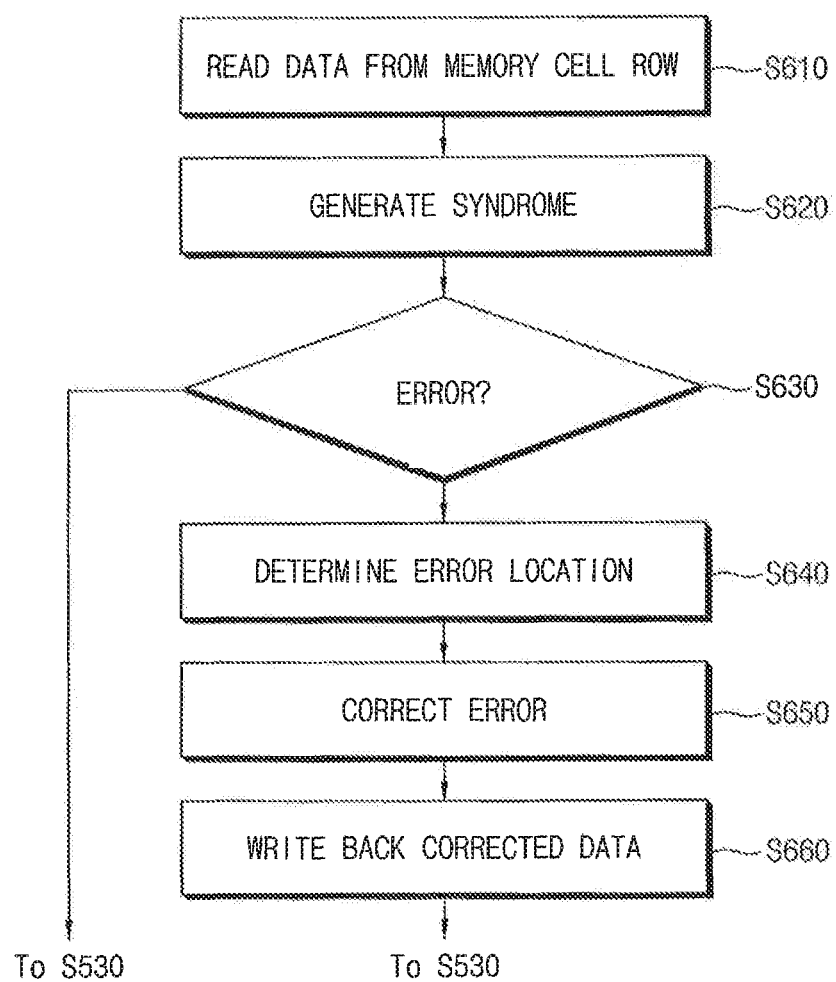
FIG. 20 is a flow chart illustrating the scrubbing operation in the method of FIG. 18 according to an exemplary embodiment of the inventive concept.

FIG. 20 is a flow chart illustrating the scrubbing operation in the method of FIG. 18 according to an exemplary embodiment of the inventive concept.

Referring to FIGS. 2, 3, and 7 through 20, when the first detection signal DET1 is applied to the control logic circuit 210, at least one sub-page of sub-pages of a second page designated by the victim address VCT_ADDR1 and the error correction circuit 400 reads a first unit of data CW including the main data MD and the parity data PRT from the selected sub-page (S610).

The ECC decoder 430 generates the syndrome data SDR (S620) to determine whether the first unit of data CW includes a bit error (S630). In an embodiment, the syndrome generator 433 generates the syndrome data SDR by checking whether each corresponding bit of the check bits CHB and the parity data PRT is identical to each other. The first unit of data CW includes a bit error when at least one bit of the syndrome data SDR is not '0'.

When the first unit of data CW includes a bit error (YES in S630), the ECC decoder 430 determines a location of at least one bit error based on the syndrome data SDR (S640), corrects the bit error based on the parity data PRT in the first unit of data (S650), and provides the corrected codeword C_CW to the I/O gating circuit. The I/O gating circuit writes back the corrected codeword C_CW into a memory location corresponding to the sub-page (S660).

When the first unit of data CW does not include a bit error (NO in S630), the error correction circuit 400 performs the above-described operation on a next sub-page of the second page.

Figure 21:
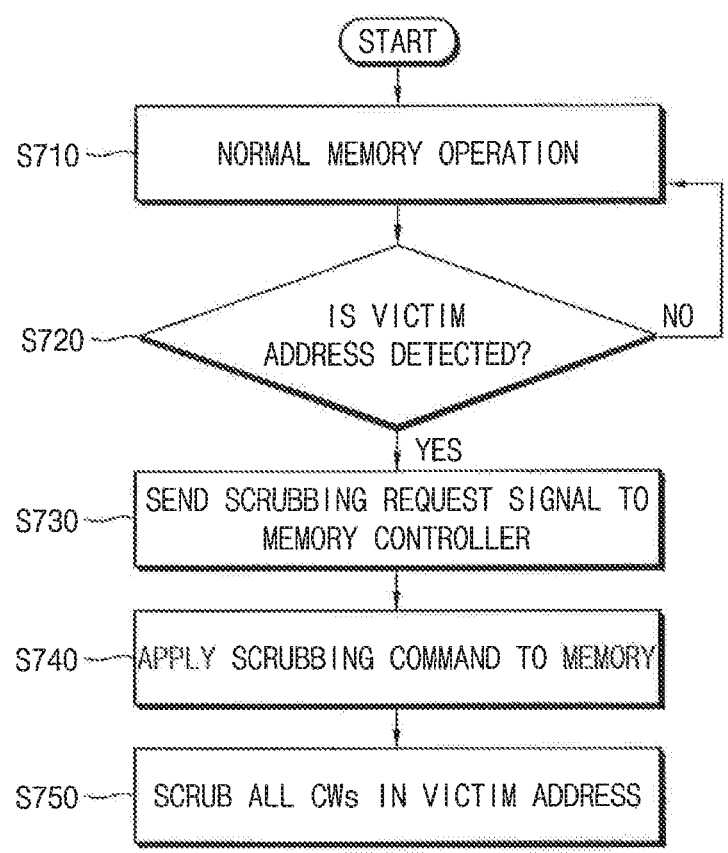
FIG. 21 is a flow chart illustrating a method of operating a semiconductor memory device according to an exemplary embodiment of the inventive concept.

FIG. 21 is a flow chart illustrating a method of operating a semiconductor memory device according to an exemplary embodiment of the inventive concept.

Referring to FIGS. 2, 3, 7 through 17, and 21 in a method of operating a semiconductor memory device 200a that includes a memory cell array 300, an error correction circuit 400 and a scrubbing controller 460, the semiconductor memory device 200a performs a normal memory operation on the memory cell array 300 in response to a command from a memory controller 100 (S710). The normal memory operation may include one of a write operation, a read operation and a refresh operation. While the normal memory operation is being performed on the memory cell array 300, the scrubbing controller 460 counts the number of accesses to a first memory region of the memory cell array 300 to determine whether a disturbance on at least one neighbor memory region located adjacent to the first memory region reaches a reference value. The scrubbing controller 460 determines whether at least one victim address is detected due to the intensive accesses to the first memory region (S720).

When the victim address is not detected, that is, when the counted number of accesses to the first memory region does not reach the reference value (NO in S720), the normal memory operation is performed on the memory cell array 300 (S710). When the victim address is detected, that is, when the counted number of accesses to the first memory region reaches the reference value (YES in S720), the scrubbing request signal generator 490 transmits the scrubbing request signal SRS to the memory controller 100 (S730).

The memory controller 100 applies the scrubbing command to the semiconductor memory device 200a in response to the scrubbing request signal SRS (S740). The control logic circuit 210 controls the scrubbing controller 460 and the error correction circuit 400 to perform the scrubbing operation on all sub-pages of the at least one neighbor memory region (S750).

Figure 22:
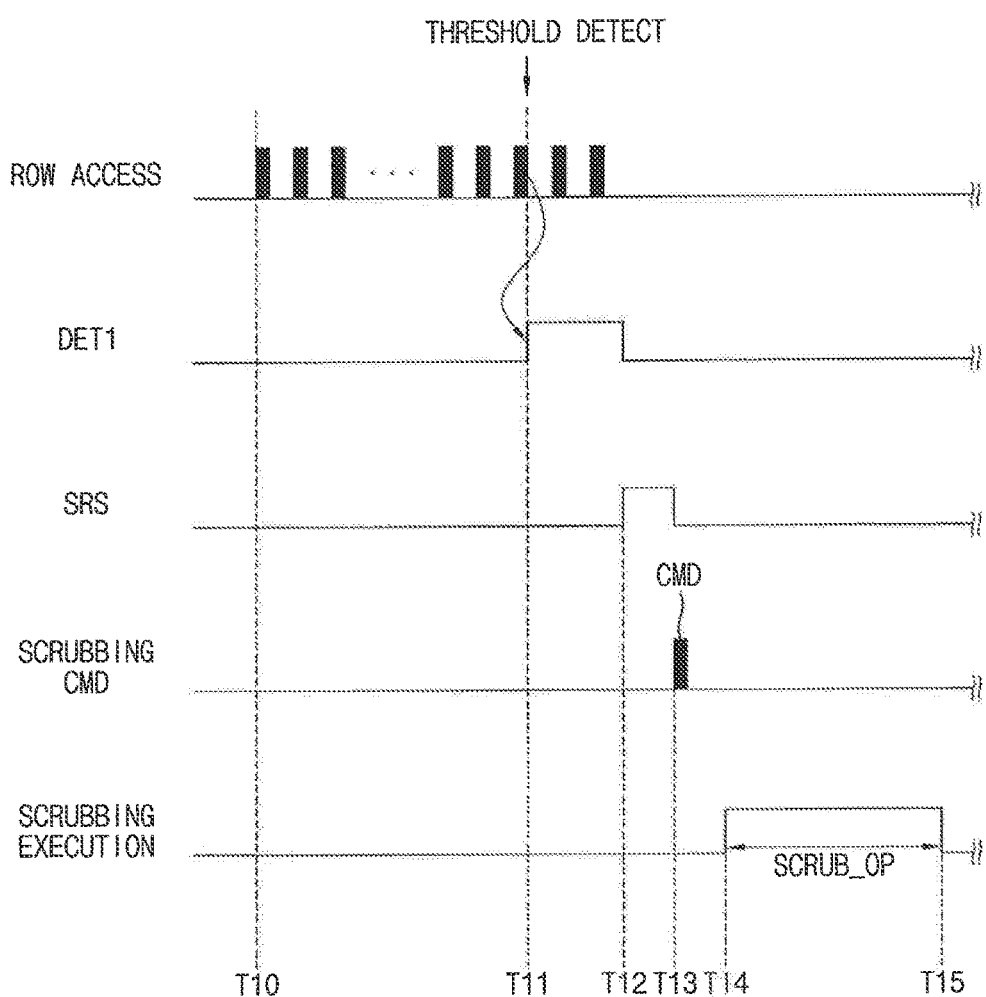
FIG. 22 is a timing diagram illustrating an example of the method of FIG. 21.

FIG. 22 is a timing diagram illustrating an example of the method of FIG. 21.

In FIG. 22, the semiconductor memory device 200a transmits the scrubbing request signal SRS to the memory controller 100, and performs, for example, the scrubbing operation in response to the scrubbing command from the memory controller 100.

A time T10 represents a time when an operation for counting the number of accesses to the first memory region starts. The disturbance detector 461 of FIG. 8 starts an operation for counting the number of accesses on a specific memory region at the time T10. For example, it is assumed that the disturbance detector 461 counts the number of accesses on one row (or one page).

At a time T11, when the counted number of accesses reaches a threshold (or, a first reference value), the disturbance detector 461 generates the first detection signal DET1 at the time T11. At a time T12, the semiconductor memory device 200a transmits the scrubbing request signal SRS to the memory controller 100, and the memory controller 100 applies the scrubbing command CMD to the semiconductor memory device 200a in response to the scrubbing request signal SRS.

The scrubbing controller 460 and the error correction circuit 400 performs a scrubbing operation SCRUB_OP consecutively on sub-pages of a second page and on sub-pages of a third page in response to the scrubbing command CMD between times T14 and T15. In an exemplary embodiment, the scrubbing operation SCRUB_OP performs an error correction on the sub-pages. The second page and the third page are located adjacent to the first memory region.

Figure 23:
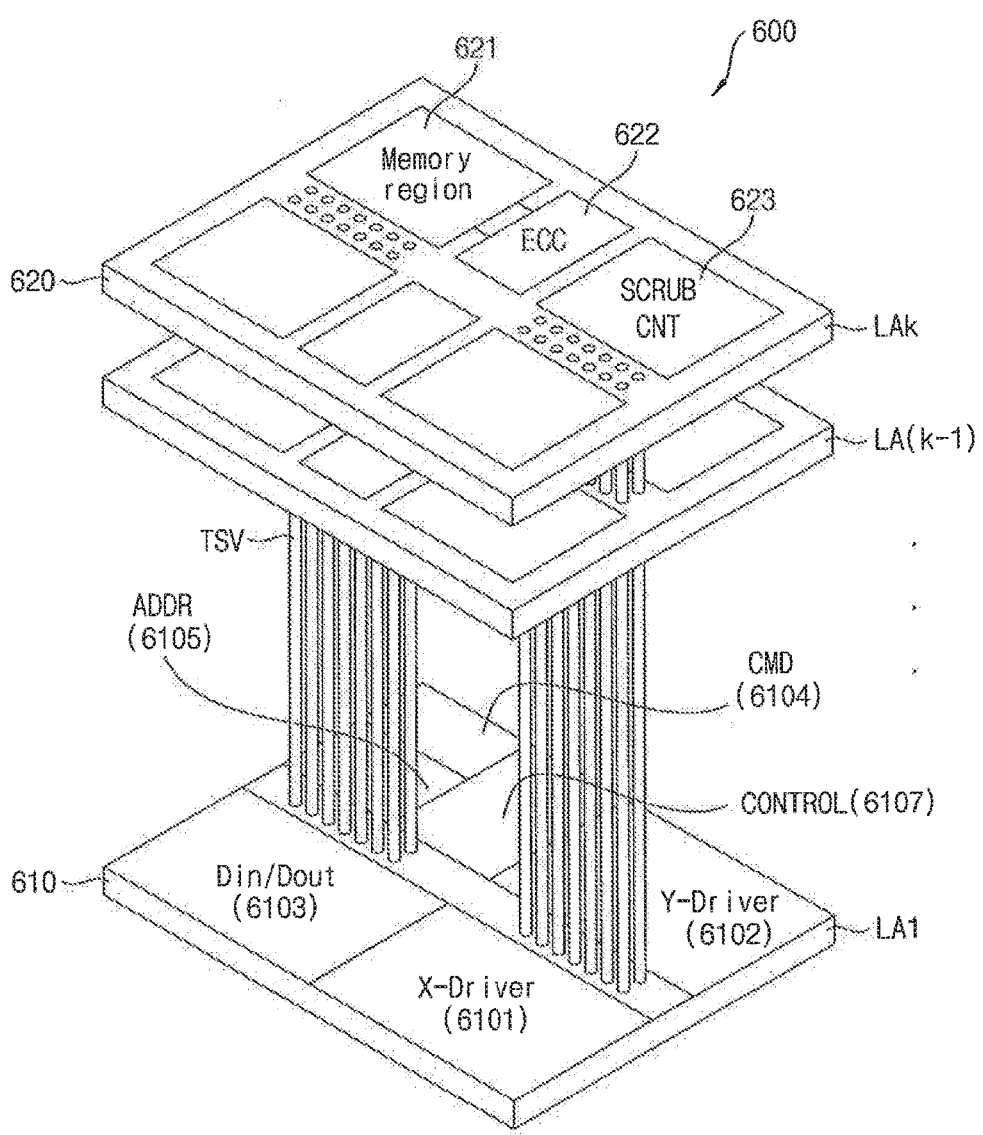
FIG. 23 is a structural diagram illustrating a semiconductor memory device according to an exemplary embodiment of the inventive concept.

FIG. 23 is a structural diagram illustrating a semiconductor memory device according to an exemplary embodiment of the inventive concept.

Referring to FIG. 23, a semiconductor memory device 600 includes first through kth semiconductor integrated circuit layers LA1 through LAk (k is an integer equal to or greater than three), in which the lowest first semiconductor integrated circuit layer LA1 is assumed to be an interface or control chip and the other semiconductor integrated circuit layers LA2 through LAk are assumed to be slave chips including core memory chips. The first through kth semiconductor integrated circuit layers LA1 through LAk may transmit and receive signals therebetween through through-silicon-vias (TSVs). The lowest first semiconductor integrated circuit layer LA1 as the interface or control chip may communicate with an external memory controller through a conductive structure formed on an external surface. A description will be made regarding structure and an operation of the semiconductor memory device 600 by mainly using the first semiconductor integrated circuit layer LA1 or 610 as the interface or control chip and the nth semiconductor integrated circuit layer LAk or 620 as the slave chip.

The first semiconductor integrated circuit layer 610 may include various peripheral circuits for driving memory regions 621 provided in the kth semiconductor integrated circuit layer 620. For example, the first semiconductor integrated circuit layer 610 may include a row (X)-driver 6101 for driving word-lines of a memory, a column (Y)-driver 6102 for driving bit-lines of the memory, a data input/output unit (Din/Dout) 6103 for controlling input/output of data, a command buffer (CMD) 6104 for receiving a command CMD from an outside source and buffering the command CMD, and an address buffer (ADDR) 6105 for receiving an address from an outside source and buffering the address. The memory region 621 may include a plurality of bank arrays in which a plurality of memory cells are arranged as described with reference to FIG. 3.

The first semiconductor integrated circuit layer 610 may further include a control logic (circuit) 6107. The control logic 6107 may access the memory region 621 and may generate control signals for accessing the memory region 621 based on the command from the memory controller.

The kth semiconductor integrated circuit layer 620 includes an error correction circuit 622 that performs an ECC encoding on data to be stored in the memory region 621 and performs an ECC decoding on data read from the memory region 621. The kth semiconductor integrated circuit layer 620 may further include a scrubbing controller 623 that detects intensive accesses to a first memory region of the memory region 621, generates a victim address of a neighbor memory region adjacent to the first memory region and adjusts timings of scrubbing operation performed on the neighbor memory region.

Figure 24:
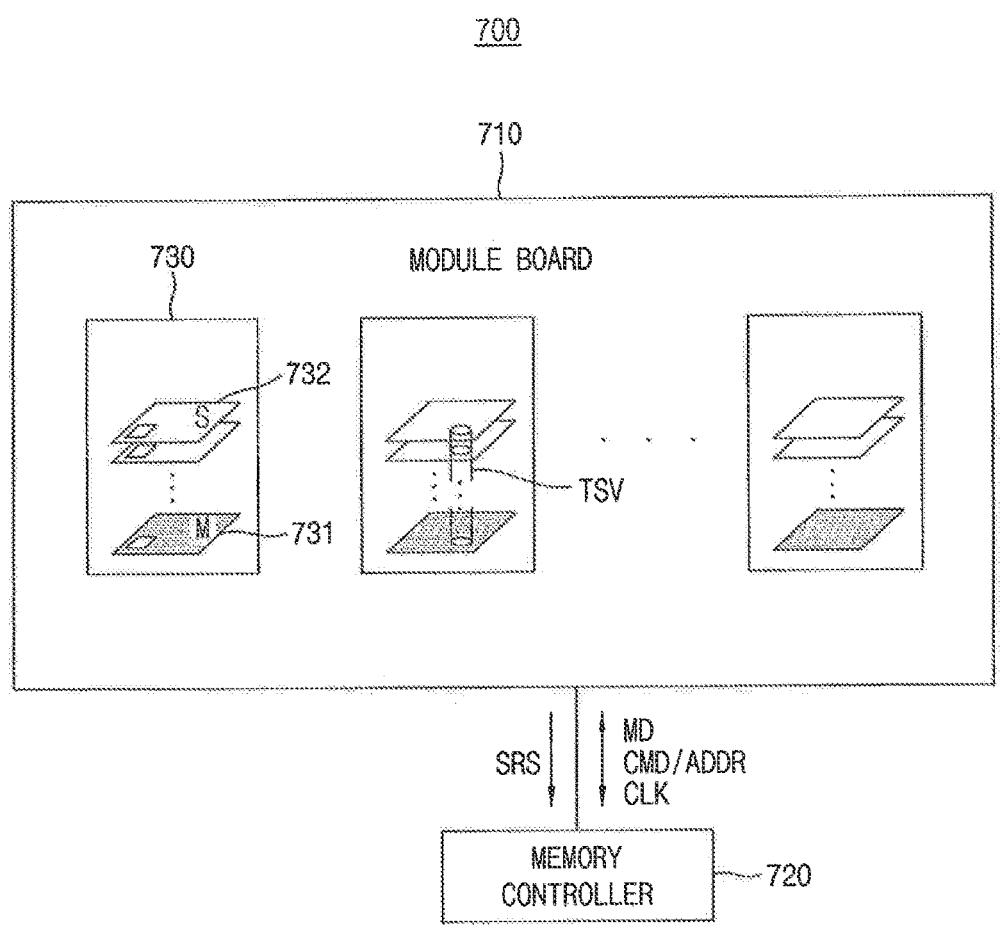
FIG. 24 illustrates a memory system including the semiconductor memory device according to an exemplary embodiment of the inventive concept.

FIG. 24 illustrates a memory system including the semiconductor memory device according to an exemplary embodiment of the inventive concept.

Referring to FIG. 24, a memory system 700 includes a memory module 710 and a memory controller 720. The memory module 710 includes at least one semiconductor memory device 730 mounted on a module board. The semiconductor memory device 730 may employ the semiconductor memory device 200a of FIG. 3. For example, the semiconductor memory device 730 may be constructed as a DRAM chip or a MRAM chip. In addition, the semiconductor memory device 730 may include a stack of semiconductor chips. In this case, the semiconductor chips may include at least one master chip 731 and at least one slave chip 732. Signal transfer between the semiconductor chips may occur via through-silicon vias TSV.

The master chip 731 and the slave chip 732 may employ the semiconductor memory device 200a of FIG. 3. Therefore, each of the master chip 731 and the slave chip 732 may include a memory cell array, a control logic circuit, an error correction circuit and a scrubbing controller as described with reference to FIGS. 2 through 22. The scrubbing controller detects intensive accesses to a first memory region of the memory cell array, generates a victim address of a neighbor memory region adjacent to the first memory region and adjusts timings of scrubbing operation performed on the neighbor memory region. The control logic circuit controls the scrubbing controller and the error correction circuit to perform the scrubbing operation on the neighbor memory region.

In addition, in embodiments of the present inventive concept, a three dimensional (3D) memory array is provided in semiconductor memory device 730. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648, which are hereby incorporated by reference in their entirety.

The memory module 710 may communicate with the memory controller 720 via a system bus. Main data MD, a command/address CMD/ADDR, and a clock signal CLK may be transmitted and received between the memory module 710 and the memory controller 720 via the system bus. The semiconductor memory device 730 may transmit a scrubbing request signal SRS to the memory controller 720 when the intensive accesses to the first memory region is detected.

Figure 25:
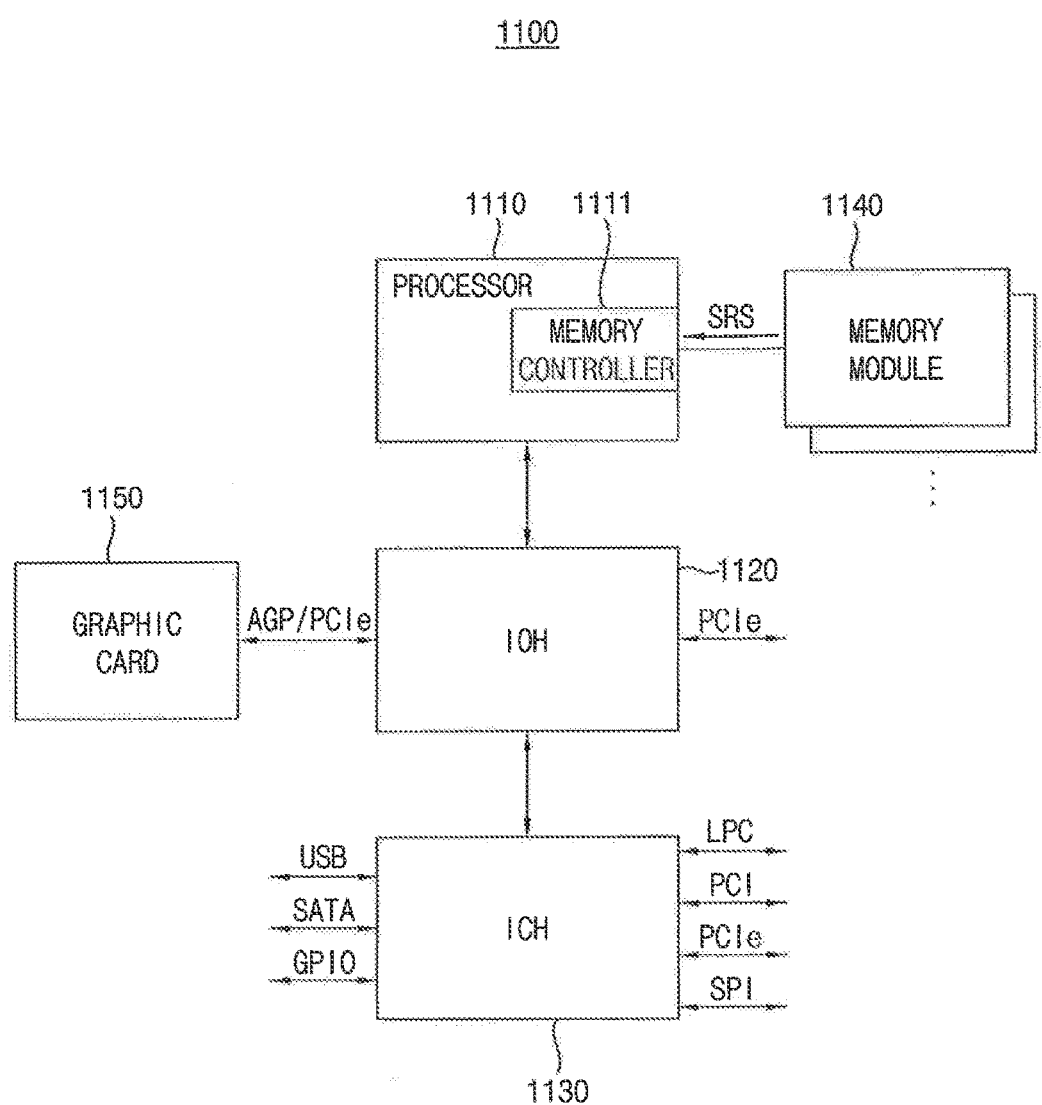
FIG. 25 is a block diagram illustrating a computing system including the semiconductor memory device according to an exemplary embodiment of the inventive concept.

FIG. 25 is a block diagram illustrating a computing system including the semiconductor memory device according to an exemplary embodiment of the inventive concept.

Referring to FIG. 25, a computing system 1100 includes a processor 1110, an input/output hub (IOH) 1120, an input/output controller hub (ICH) 1130, at least one memory module 1140 and a graphics card 1150. In some embodiments, the computing system 1100 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1110 may perform various computing functions, such as executing specific software for performing specific calculations or tasks. For example, the processor 1110 may be a microprocessor, a central processing unit (CPU), a digital signal processor, or the like. In some embodiments, the processor 1110 may include a single core or multiple cores. For example, the processor 1110 may be a multi-core processor, such as a dual-core processor, a quad-core processor, a hexa-core processor, etc. Although FIG. 21 illustrates the computing system 1100 including one processor 1110, in some embodiments, the computing system 1100 may include a plurality of processors. The processor 1110 may include an internal or external cache memory.

The processor 1110 may include a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may be implemented with multiple channels, to each of which at least one memory module 1140 may be coupled. In some embodiments, the memory controller 1111 is located inside the input/output hub 1120, which may be referred to as a memory controller hub (MCH).

The memory module 1140 may include a plurality of semiconductor memory devices that store data provided from the memory controller 1111. Each of the plurality of semiconductor memory devices may employ the semiconductor memory device 200a of FIG. 3. Therefore, each of the plurality of semiconductor memory devices may include a memory cell array, a control logic circuit, an error correction circuit and a scrubbing controller as described with reference to FIGS. 2 through 22. The scrubbing controller detects intensive accesses to a first memory region of the memory cell array, generates a victim address of a neighbor memory region adjacent to the first memory region and adjusts timings of a scrubbing operation performed on the neighbor memory region. The control logic circuit controls the scrubbing controller and the error correction circuit to perform the scrubbing operation on the neighbor memory region. Each of the semiconductor memory devices may transmit a scrubbing request signal SRS to the memory controller 1111 when the intensive accesses to the first memory region is detected.

The input/output hub 1120 may manage data transfer between the processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a HyperTransport, a lightning data transport (LDT), a QuickPath interconnect (QPI), a common system interface (CSI), etc. Although FIG. 25 illustrates the computing system 1100 including one input/output hub 1120, in some embodiments, the computing system 1100 includes a plurality of input/output hubs.

The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal semiconductor memory device. In some embodiments, the input/output hub 1120 may include an internal graphics device along with or instead of the graphics card 1150 outside the input/output hub 1120. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration in order to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

Aspects of the present inventive concept may be applied to systems using semiconductor memory devices. For example aspects of the present inventive concept may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, or other such electronic devices.

The foregoing is illustrative of exemplary embodiments of the inventive concept and is not to be construed as limiting thereof. Although a few example embodiments have been described, those skilled in the art will readily appreciate that many modifications are possible in the exemplary embodiments without materially departing from the present inventive concept. Accordingly, all such modifications are intended to be included within the scope of the present inventive concept.

What is claimed is:

1. A semiconductor memory device comprising:
   a memory cell array including a plurality of memory bank arrays, wherein each memory bank array includes a plurality of pages; and
   a main controller configured to count a number of accesses to a first memory region of the memory cell array, generate at least one victim address of at least one neighbor memory region that is adjacent to the first memory region and perform a scrubbing operation on sub-pages of the pages corresponding to the at least one victim address when the counted number of accesses reaches a first reference value during a reference interval to correct at least one error in at least one of the sub-pages caused by a capacitive coupling between the first memory region and the at least one neighbor memory region.

2. The semiconductor memory device of claim 1, wherein the main controller comprises:
   a scrubbing controller configured to generate an internal timing control signal in response to a first command received from a memory controller; and
   an error correction circuit configured to perform the scrubbing operation on the sub-pages in response to the internal timing control signal.

3. The semiconductor memory device of claim 2, wherein the error correction circuit is configured to perform the scrubbing operation sequentially on the sub-pages, in which the error correction circuit reads a first unit of data including main data and parity data from each of the sub-pages, corrects at least one bit error in the first unit of data and writes back the corrected first unit of data into a memory location of each of the sub-pages when a control circuit of the main controller receives the first command from the memory controller.

4. The semiconductor memory device of claim 3, wherein a size of the first unit of data is the same as a size of a codeword of the semiconductor memory device and the first command is an auto refresh command.

5. The semiconductor memory device of claim 1, wherein the first memory region includes a first page of the plurality of pages, the pages corresponding to the at least one victim address include a second page and a third page of the plurality of pages and the second page and the third page are located adjacent to the first page.

6. The semiconductor memory device of claim 5, wherein the main controller is configured to perform the scrubbing operation on some sub-pages of the second page whenever an auto refresh command is received from a memory controller, and wherein the main controller is configured to perform the scrubbing operation on some sub-pages of the third page after the scrubbing operation on the second page is completed.

7. The semiconductor memory device of claim 2, wherein the scrubbing controller comprises:
   a disturbance detector configured to count the number of accesses to the first memory region to generate a first detection signal when the number of the counted accesses reaches the first reference value during the reference interval;

a victim address generator configured to generate the at least one victim address in response to the first detection signal;

an internal scheduler configured to receive an auto refresh signal corresponding to the auto refresh command from a control circuit of the main controller to generate the internal timing control signal;

an address manager configured to receive the auto refresh signal, the internal timing control signal and the at least one victim address, to provide the at least one victim address to a row decoder, and to provide a column decoder with a counting signal designating some sub-pages of the sub-pages corresponding to the at least one victim address; and an error counter configured to count a number of error generation signals that the error correction circuit generates when each of the some sub-pages include an a bit error, and configured to generate a second detection signal when the counted number of the error generation signals reaches a second reference value.

8. The semiconductor memory device of claim 7, wherein the address manager includes a codeword counter configured to increase a value of the counting signal whenever the codeword counter receives the auto refresh signal.

9. The semiconductor memory device of claim 7, wherein the disturbance detector comprises:
an access counter configured to count a number of accesses to the first memory region;
a reference value register configured to store the first reference value; and
a comparator configured to compare the counted number of accesses and the first reference value to generate the first detection signal.

10. The semiconductor memory device of claim 9, wherein the comparator is configured to activate the first detection signal when the counted number of accesses reaches the first reference value.

11. The semiconductor memory device of claim 7, further comprising:
a scrubbing request signal generator configured to provide a scrubbing request signal to the memory controller in response to one of the first detection signal and the second detection signal.

12. The semiconductor memory device of claim 11, wherein the memory controller is configured to issue a scrubbing command to the semiconductor memory device in response to the scrubbing request signal.

13. The semiconductor memory device of claim 1, wherein the memory cell array includes a three-dimensional memory cell array and each of the memory bank arrays includes a plurality of dynamic memory cells.

14. A memory system comprising:
the semiconductor memory device of claim 1; and
a memory controller configured to control the semiconductor memory device.

15. A method of operating a semiconductor memory device including a memory cell array, the method comprising:
counting, by a first controller of the memory device, a number of accesses to a first memory region of the memory cell array to determine whether a disturbance on at least one neighbor memory region reaches a reference value, the at least one neighbor memory region being located adjacent to the first memory region; and
performing, by a second controller of the memory device, a scrubbing operation on some sub-pages of the at least one neighbor memory region when the counted number of accesses reaches the reference value to correct at least one error in at least one of the sub-pages caused by a capacitive coupling between the first memory region and the at least one neighbor memory region.

16. The method of claim 15, wherein the scrubbing operation is performed sequentially on the some sub-pages whenever an auto refresh command is received from a memory controller.

17. The method of claim 15, further comprising:
transmitting, by the semiconductor memory device, a scrubbing request signal to a memory controller when the disturbance reaches the reference value,
wherein the scrubbing operation is performed consecutively on the sub-pages based on a scrubbing command received from the memory controller responding to the scrubbing request signal.

18. A semiconductor memory device comprising:
a memory cell array;
a main controller configured to receive an access command through a first pin of the memory device and a memory address through a second pin of the memory device to access a first memory region of the memory cell array, output a signal to a memory controller through a third pin of the memory device when accesses to the first memory region have exceeded a reference value during a given time interval, and perform a scrubbing operation on a second memory region adjacent to the first memory region in response to a scrubbing command received from the memory controller through the first pin and sent by the memory controller in response to the signal, to correct at least one error in the second memory region caused by a capacitive coupling between the first memory region and the second memory region.

19. The semiconductor memory device of claim 18, wherein the access command is a read or a write command, and the semiconductor memory device includes a fourth pin distinct from the third pin for receiving data associated with the write command or transmitting data associated with the read command.

20. The semiconductor memory device of claim 18, wherein the main controller counts a number of accesses to a word-line of the memory array cell based on a row address of the memory address, generates a victim address in the second memory region when the number exceeds the reference value during a given time interval, and performs the scrubbing operation on a page of the second memory region having the victim address in response to the scrubbing command during a refresh of the memory cell array.

* * * * *